(12) United States Patent
Landwehr et al.

(10) Patent No.: US 11,827,986 B2
(45) Date of Patent: Nov. 28, 2023

(54) COATING SYSTEM INCLUDING NUCLEATING AGENT

(71) Applicants: Rolls-Royce Corporation, Indianapolis, IN (US); Rolls-Royce plc, London (GB); Rolls-Royce North American Technologies, Inc., Indianapolis, IN (US)

(72) Inventors: Sean E. Landwehr, Avon, IN (US); Ngunjoh Lawrence Ndamka, Derby (GB); Matthew R. Gold, Carmel, IN (US); Michael Cybulsky, Indianapolis, IN (US); Li Li, Carmel, IN (US); Robert Golden, Richmond, VA (US)

(73) Assignees: Rolls-Royce Corporation, Indianapolis, IN (US); Rolls-Royce North American Technologies, Inc., Indianapolis, IN (US); Rolls-Royce plc, London (GB)

( * ) Notice: Subject to any disclaimer, the term of this patent is extended or adjusted under 35 U.S.C. 154(b) by 1081 days.

(21) Appl. No.: 16/355,056

(22) Filed: Mar. 15, 2019

(65) Prior Publication Data
US 2019/0284673 A1    Sep. 19, 2019

Related U.S. Application Data

(60) Provisional application No. 62/661,318, filed on Apr. 23, 2018, provisional application No. 62/644,251, filed on Mar. 16, 2018.

(51) Int. Cl.
    C23C 4/04       (2006.01)
    C04B 41/50      (2006.01)
    (Continued)

(52) U.S. Cl.
    CPC .......... *C23C 28/345* (2013.01); *C04B 41/459* (2013.01); *C04B 41/5024* (2013.01);
    (Continued)

(58) Field of Classification Search
    None
    See application file for complete search history.

(56) References Cited

U.S. PATENT DOCUMENTS 4,547,536 A    10/1985  Nabors
6,284,682 B1    9/2001  Troczynski et al.
(Continued)

FOREIGN PATENT DOCUMENTS

JP        2012254914 A    12/2012

OTHER PUBLICATIONS

Response to Extended Search Report dated Aug. 29, 2019, from counterpart European Application No. 19163240.5, filed Mar. 27, 2020, 10 pp.
(Continued)

*Primary Examiner* — Elizabeth Collister
(74) *Attorney, Agent, or Firm* — Shumaker & Sieffert, P.A.

(57) ABSTRACT

In some examples, an article may include a substrate and a coating system on the substrate. The coating system may include a layer comprising a plurality of voids, wherein respective voids of the plurality of voids define respective void volumes; and a nucleating agent within at least some of the respective void volumes of the layer, wherein the nucleating agent is configured to induce crystallization of the molten CMAS. The coating system may include an environmental barrier coating, thermal barrier coating, and/or abradable coating.

19 Claims, 15 Drawing Sheets

(51) Int. Cl.
*C23C 28/00* (2006.01)
*C23C 4/134* (2016.01)
*C23C 14/06* (2006.01)
*C23C 14/30* (2006.01)
*C23C 28/04* (2006.01)
*C04B 41/45* (2006.01)

(52) U.S. Cl.
CPC ............... *C23C 4/04* (2013.01); *C23C 4/134* (2016.01); *C23C 14/06* (2013.01); *C23C 14/30* (2013.01); *C23C 28/042* (2013.01); *C23C 28/044* (2013.01); *C23C 28/321* (2013.01); *C23C 28/322* (2013.01); *C23C 28/3215* (2013.01); *C23C 28/34* (2013.01); *C23C 28/347* (2013.01); *C23C 28/3455* (2013.01); *Y10T 428/249953* (2015.04)

(56) References Cited

U.S. PATENT DOCUMENTS

| | | | |
|---|---|---|---|
| 6,863,999 | B1 | 3/2005 | Sudre et al. |
| 7,001,679 | B2 | 2/2006 | Campbell et al. |
| 7,666,528 | B2 | 2/2010 | Hazel et al. |
| 9,945,036 | B2 | 4/2018 | Meschter et al. |
| 2006/0280954 | A1* | 12/2006 | Spitsberg ............ C04B 41/009 427/372.2 |
| 2006/0280955 | A1 | 12/2006 | Spitsberg et al. |
| 2007/0119713 | A1* | 5/2007 | Hasz ................... C25D 7/10 204/490 |
| 2011/0300357 | A1 | 12/2011 | Witz et al. |
| 2015/0247245 | A1 | 9/2015 | Wali |
| 2015/0267058 | A1 | 9/2015 | Lee |
| 2016/0115818 | A1* | 4/2016 | Porob .................. C04B 35/16 428/457 |
| 2016/0168684 | A1 | 6/2016 | Brosnan et al. |
| 2016/0273088 | A1 | 9/2016 | Cybulsky et al. |
| 2016/0347671 | A1 | 12/2016 | Strock |
| 2017/0022113 | A1 | 1/2017 | Opila |
| 2017/0167279 | A1 | 6/2017 | Kirby et al. |
| 2017/0321559 | A1 | 11/2017 | Chapman et al. |
| 2018/0119270 | A1* | 5/2018 | Hoel .................... C23C 4/18 |
| 2018/0163062 | A1* | 6/2018 | Hoel .................. C04B 35/62222 |

OTHER PUBLICATIONS

Communication pursuant to Article 94(3) EPC from counterpart European Application No. 19163240.5 dated Jul. 14, 2022, 8 pp.
Response to Examination Report dated Dec. 7, 2020, filed Apr. 6, 2021, for counterpart European Application No. 19163240.5, 126 pp.
Boakye et al., "Synthesis of Nanosized Spherical Rhabdophane Particles," Journal of the American Ceramic Society, vol. 88, No. 10, Oct. 2005, pp. 2740-2746.
Guo et al., "Sol-Gel Synthesis of Microcrystalline Rare Earth Orthophosphates," Journal of Materials Research, vol. 11, No. 3, Mar. 1996, pp. 639-649.
Examination Report from counterpart European Application No. 19163240.5, dated Dec. 7, 2021, 7 pp.
Extended Search Report from counterpart European Application No. 19163240.5, dated Aug. 29, 2019, 7 pp.
Ni et al., "Crystal Chemistry of the Monazite and Xenotime Structures," American Mineralogist, vol. 80, Nov. 13, 1995, pp. 21-26.
Kramer et al., "Infiltration-Inhibiting Reaction of Gadolinium Zirconate Thermal Barrier Coatings with CMAS Melts," Journal of the American Ceramic Society, vol. 91, No. 2, Feb. 2008, 26 pp.
Jacobson, "Corrosion of Silicon-Based Ceramics in Combustion Environments," Journal of the American Ceramic Society, vol. 76, No. 1, Apr. 1993, pp. 3-28.
Webster et al., "Investigation of Rare Earth Titanates as Potential Environmental Barrier Coating (EBC) Constituents for Mitigation of CMAS Attack," Aug. 2017, 1 pp.
Levi et al., "Environmental Degradation of Thermal Barrier Coatings by Molten Deposits," MRS Bulletin, vol. 37, Oct. 2012, 10 pp. 932-941.
Fair et al., "Precipitation Coating of Monazite on Woven Ceramic Fibers: I. Feasibility," Journal of the American Ceramic Society, vol. 90, No. 2, Feb. 2007, pp. 448-455.
Fair et al., "Precipitation Coating of Rare-Earth Orthophosphates on Woven Ceramic Fibers—Effect of Rare-Earth Cation on Coating Morphology and Coated Fiber Strength," Journal of the American Ceramic Society, vol. 91, No. 7, May 2008, pp. 2117-2123.
Padture et al., "Thermal Barrier Coatings for Gas-Turbine Engine Applications," Science, vol. 296, Apr. 12, 2002, pp. 280-284.
Klemm, "Silicon Nitride for High-Temperature Applications," Journal of the American Ceramic Society, vol. 93, No. 6, Jun. 2010, pp. 1501-1522.
Boakye et al., "Synthesis and Phase Composition of Lanthanide Phosphate Nanoparticles LnPO4 (Ln = La, Gd, Tb, Dy, Y) and Solid Solutions for Fiber Coatings," Journal of the American Ceramic Society, vol. 91, No. 7, Nov. 2008, pp. 3841-3849.
Mercer et al., "On a Ferroelastic Mechanism Governing the Toughness of Metastable Tetragonal-Prime (t')Yttria-Stabilized Zirconia," Proceedings of the Royal Society A, vol. 463, No. 2081, Mar. 6, 2007, pp. 1393-1408.
Wiesner et al., "Calcium-Magnesium Aluminosilicate (CMAS) Interactions with Advanced Environmental Barrier Coating Material," NASA Glenn Research Center, 11th International Conference on Ceramic Materials and Components for Energy and Environmental Applications, Jun. 18, 2015, 16 pp.
Hench, "Bioceramics: From Concept to Clinic," Journal of the American Ceramic Society, vol. 74, No. 7, Jul. 1991, pp. 1487-1510.
Morgan et al., "Ceramic Composites of Monazite and Alumina," Journal of the American Ceramic Society, vol. 78, No. 6, Jan. 13, 2015, pp. 1553-1563.
Response to Communication pursuant to Article 94(3) EPC dated Jul. 14, 2022, from counterpart European Application No. 19163240.5 filed Nov. 9, 2022, 35 pp.

* cited by examiner

COATING SYSTEM INCLUDING NUCLEATING AGENT

This application claims the benefit of U.S. Provisional Patent Application No. 62/644,251, filed Mar. 16, 2018, and U.S. Provisional Patent Application No. 62/661,318, filed Apr. 23, 2018. The entire content of these applications is incorporated herein by reference.

TECHNICAL FIELD

The present disclosure generally relates to coating systems for high-temperature mechanical systems, such as gas turbine engines.

BACKGROUND

The components of gas turbine engines operate in severe environments. For example, the high-pressure turbine airfoils exposed to hot gases in commercial aeronautical engines typically experience surface temperatures of about 1000° C. Components of high-temperature mechanical systems may include a superalloy substrate, a ceramic substrate, or a ceramic matrix composite (CMC) substrate. In many examples, the substrates may be coated with one or more coatings to modify properties of the surface of the substrate. For example, superalloy, ceramic, or CMC substrates may be coated with a thermal barrier coating to reduce heat transfer from the external environment to the substrate, an environmental barrier coating to reduce exposure of the substrate to environmental species, such as oxygen, water vapor, or Calcium-Magnesium-Alumino-Silicate (CMAS) containing materials, an abradable coating to improve a seal between the substrate and an adjacent component, or combinations thereof.

SUMMARY

The disclosure describes, articles, systems, and techniques relating to coating systems that may be applied to an underlying substrate. The coating system may include a thermal barrier coating (TBC), environmental barrier coating (EBC), and/or abradable coating. The coating system also includes one or more components to contribute to resistance of the coating system to damage from Calcium-Magnesium-Alumino-Silicate (CMAS) containing materials. In some examples, a coating system is on a substrate, and the coating system may include at least one coating or coating layer that includes a plurality of voids. For example, the coating may include a plurality of pores (e.g., of a porous microstructure) or may include a plurality of intercolumnar voids (e.g., of a columnar microstructure). The coating may also include a nucleating agent within at least some voids of a plurality of voids of the coating, on the coating, or both. The presence of the nucleating agent on the coating and/or within at least some voids of the plurality of voids of the coating may induce crystallization of molten CMAS, e.g., to form a barrier that prevents or otherwise reduces permeation of residual molten CMAS glass into the coating. In this manner, the nucleating agent may prevent or otherwise reduce dissolution of the coating in CMAS glass, penetration of CMAS through the coating, or both.

In some examples, the disclosure describes articles, systems, and techniques relating to an EBC system, TBC system and/or abradable coating system. For example, an EBC system may protect an underlying substrate from damage due to Calcium-Magnesium-Alumino-Silicate (CMAS) containing materials. Similarly, the EBC system may also be CMAS resistant, e.g., the EBC system itself may be resistant to damage caused by CMAS. In some examples, the system includes an EBC layer on a substrate, and the EBC layer includes a plurality of voids. For example, the EBC layer may include a plurality of pores (e.g., of a porous microstructure), a plurality of intercolumnar voids (e.g., of a columnar microstructure), cracks and/or other voids in the EBC layer. The voids may be surface voids and/or subsurface voids in the EBC layer. The EBC system may also include a nucleating agent within at least some voids of the plurality of voids of the EBC, on the EBC layer, or both. The presence of the nucleating agent on the EBC layer and/or within at least some voids of the plurality of voids of the EBC layer may induce crystallization of molten CMAS, e.g., to form a barrier that prevents or otherwise reduces permeation of residual molten CMAS glass into the EBC layer. In this manner, the nucleating agent may prevent or otherwise reduce dissolution of the EBC in CMAS glass, penetration of CMAS through the EBC layer, or both.

In some examples, the coating system may include a TBC, EBC, and/or an abradable coating. The coating system may include the coating and a rare-earth metal phosphate (and/or other nucleating agent) within at least some voids of the plurality of voids of the coating. In some examples, the coating system may additionally or alternatively include a rare-earth metal phosphate layer on the coating. The presence of the rare-earth metal phosphate within at least some voids of the plurality of voids of the coating may result in the coating system have increased resistance to deleterious environmental species, such as CMAS, in comparison to some coating systems not including the rare-earth metal phosphate (or other nucleating agent).

In one example, the disclosure is directed to an article comprising a substrate; and a coating system on the substrate, the coating system comprising a layer comprising a plurality of voids, wherein respective voids of the plurality of voids define respective void volumes; and a nucleating agent within at least some of the respective void volumes of the layer, wherein the nucleating agent is configured to induce crystallization of the molten CMAS.

In another example, the disclosure is directed to a method comprising applying a coating system on a substrate, wherein the coating system includes a layer comprising a plurality of voids, wherein respective voids of the plurality of voids define respective void volumes; and a nucleating agent within at least some of the respective void volumes of the layer, wherein the nucleating agent is configured to induce crystallization of the molten CMAS.

In another example, the disclosure is directed to an article comprising a substrate; a coating system on the substrate, the coating system comprising a thermal barrier coating (TBC) or an abradable coating comprising a plurality of voids; and a rare-earth metal phosphate comprising a monazite phase rare-earth phosphate comprising at least one of lanthanum phosphate or cerium phosphate, and a xenotime phase rare-earth phosphate comprising at least one of yttrium phosphate, dysprosium phosphate, ytterbium phosphate, or lutetium phosphate, wherein the rare-earth metal phosphate comprises a greater amount of the monazite phase rare-earth phosphate than the xenotime phase rare-earth phosphate, and wherein the rare-earth metal phosphate partially fills at least some voids of the plurality of voids of the TBC or the abradable coating.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
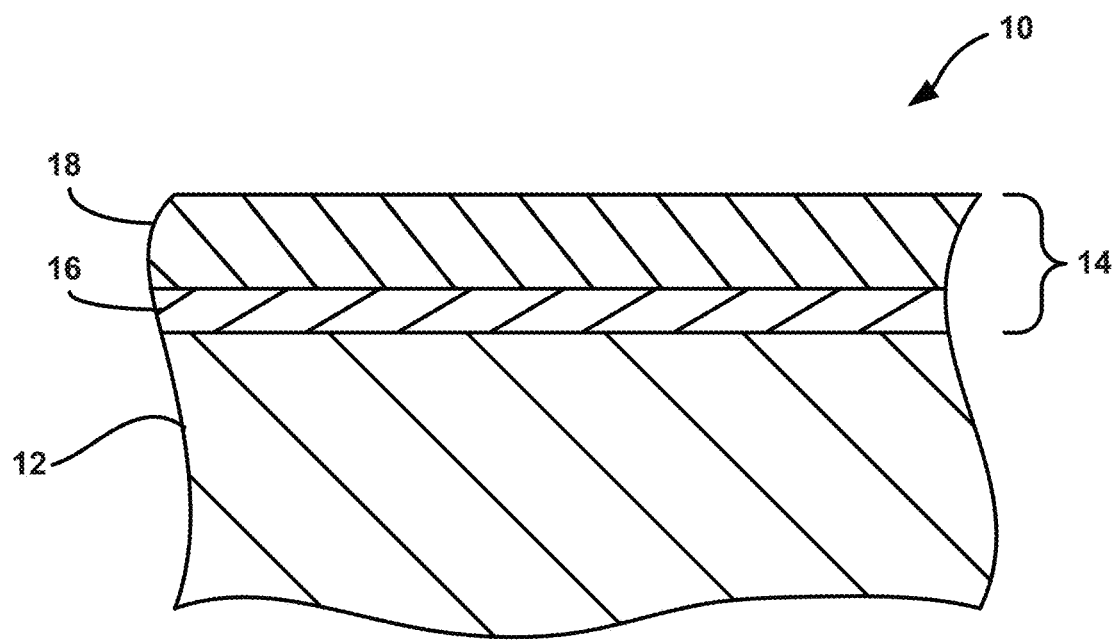
FIG. 1 is a conceptual diagram illustrating an example article including a substrate and a coating system including an EBC layer and a nucleating agent.

The disclosure describes articles, systems, and techniques relating to a coating system (e.g., an EBC system, TBC system and/or abradable coating system). For ease of description, examples of the present disclosure are primarily be described with regard to FIGS. 1-6 in the context of EBC coating systems and/or abradable coating systems. However, such examples may also be applicable to TBC systems. The examples of FIGS. 7-10 are primarily described in the context of TBC systems. However, such examples may also be applicable to EBC and/or abradable systems.

In some examples, the coating system may include at least one layer for providing increased protection to the coating system against Calcium-Magnesium-Alumino-Silicate (CMAS). In some examples, the coating system includes an EBC layer and a nucleating agent on the EBC layer and/or within voids of the EBC layer, where the nucleating agent is configured to induce crystallization of molten CMAS. The EBC layer of the coating system may be configured as an abradable EBC, or non-abradable EBC (e.g., based on the porosity of the EBC, among others). Additionally, or alternatively, the EBC layer may be a TBC layer and/or abradable layer. The nucleating agent may increase the CMAS resistance of the coating system in comparison to some coating systems not including the nucleating agent, e.g., by reacting with CMAS or components of CMAS and causing crystallization of CMAS within the voids of the EBC layer, thus reducing further infiltration of molten CMAS into voids of the EBC layer or layers below the EBC layer. In turn, the useful life of the component and/or the underlying substrate may be increased. Moreover, in some examples, the nucleating agent in the abradable and non-abradable coating system may provide such CMAS resistance while also providing improved oxidation and water vapor resistance to the EBC system. Improved oxidation and water vapor resistance of the EBC system can be achieved by blocking fast diffusion pathways (such as pores, cracks, grain boundaries) with the nucleating agent to slow the ingress of oxygen or water vapor and by using nucleating agents that have a high affinity for oxygen and are stable in water vapor.

In the context of gas turbine engines, increasing demands for greater operating efficiency (e.g., fuel efficiency) has led to the operation of gas turbine engines at higher temperatures. In some examples, substrates of high-temperature mechanical systems are coated with an EBC to provide environmental protection for the underlying substrate material(s) in a high temperature environment. The EBC may have a porous or a columnar microstructure (e.g., a microstructure including a plurality of voids).

The increased operating temperatures, however, may lead to increased damage due to the presence of CMAS deposits within the high temperature environments. The presence of CMAS deposits in the high temperature environments of a gas turbine engine may result from the ingestion of siliceous minerals (e.g., airborne dust, sand, volcanic dust and ashes, fly ash, runway debris, concrete dust, fuel residue, and the like) in the intake gas drawn through the gas turbine engine.

In at least some instances, the CMAS deposits have melting temperatures in the vicinity of about 1200° C. to about 1250° C. (e.g., about 2200° F. to about 2300° F.). Therefore, due to the high temperature environments in which the described components are operated, the CMAS deposits may melt and migrate into one or more of the outer EBC layers of the component, e.g., through voids within the EBC layer. The CMAS migration may be by way of diffusion and/or flow. In some examples, when the component cools below a melting temperature of the CMAS deposits, the CMAS deposit will solidify and exert a strain on the coating layers in which the CMAS solidified, leading to the development of fractures and/or spallation of the coating layers. In all, the deleterious reactions and damage associate with CMAS may significantly reduce the useful life of the outer EBC layers or underlying component.

In some examples, substrates of high-temperature mechanical systems may be coated with an abradable EBC system, e.g., to form a seal with a second component and reduce fluid leakage. For example, as a turbine blade rotates, a tip of the turbine blade intentionally contacts the abradable EBC layer and wears away a portion of the layer to form a groove in the abradable EBC layer corresponding to the path of the turbine blade, which may reduce the gap between a tip of the turbine blade and the surrounding blade track or blade shroud. The intimate fit between the blade tip and abradable coating provides a seal, which may reduce or eliminate leakage of gas around the blade tip and increase the efficiency of the gas turbine engine, e.g., by up to 5% in some cases. In some examples, an abradable EBC layer may have a microstructure including a plurality of voids so that the abradable layer is more easily abraded by the blade tip, e.g., when the EBC layer exhibits a density less than (porosity greater than) that of the density (porosity) of the contacting blade tip. Like a non-abradable EBC coating, deleterious environmental species may penetrate the abradable EBC layer (e.g., through the plurality of voids), which may weaken or degrade the abradable coating layers, resulting in spalling of the abradable coating from the substrate. Such penetration may be increased in an abradable EBC layer compared to non-abradable EBC layer, e.g., due to the greater amount of void fraction resulting from the higher porosity of the abradable EBC layer.

In some aspects, the EBC systems described herein include an EBC layer (which may be abradable or non-abradable) with a plurality of voids and a nucleating agent at least one of on the EBC layer or within at least some of the voids of the plurality of voids. For example, each respective void of the plurality of voids may define a respective void volume, and the nucleating agent may be within at least some of the respective void volumes. As another example, the nucleating agent may be deposited as particles or a substantially continuous layer on the outer surface of the EBC layer. The nucleating agent may increase the CMAS resistance of the coating system in comparison to some coating systems not including the nucleating agent, e.g., by initiating crystallization of CMAS, thus reducing further infiltration of molten CMAS into voids of the EBC layer. For example, the nucleating agent may react with CMAS or components of CMAS and cause crystallization of CMAS, thus reducing further infiltration of molten CMAS into voids of the EBC layer.

In some examples, the nucleating agent may be deposited on the EBC layer and/or within the voids of the EBC layer after the EBC layer has been applied to a substrate. For example, the EBC layer may be formed on a substrate by thermal spraying the EBC layer material in powder form or by a EB-PVD process, e.g., to provide for an EBC layer having a columnar structure. The nucleating agent may then be depositing within at least a portion of the voids of the formed EBC layer, e.g., by painting or otherwise depositing a slurry suspension (cement or solvent) containing the nucleating agent onto the surface of the EBC layer. Additionally or alternatively, the slurry suspension may be vacuum impregnated or otherwise infiltrated into the surface and/or subsurface voids of the EBC layer. The cement or solvent of the slurry may then be removed (e.g., via air drying or burning out through heat treatment) to leave the nucleating agent within the voids of the EBC layer. In some examples, EB-PVD or other vapor depiction process such as DVD may be used to deposit the nucleating material in the void volume of an EBD layer.

In some examples, the nucleating agent may be deposited within some of the voids of an EBC layer with the application of the EBC layer on a substrate. For example, in the case of an EBC layer with relatively high porosity, such as an abradable EBC layer, the EBC layer material applied to a substrate may include a fugitive material (e.g., polyester) which is later burned out or otherwise removed after the EBC layer material is deposited to form voids in the remaining EBC layer. In such examples, the nucleating agent may be incorporated or otherwise attached to the fugitive material when the EBC layer material is applied to the substrate to form the EBC layer such that the nucleating agent remains in the voids formed when the fugitive material is removed from the EBC layer. In this manner, the nucleating agent may be deposited in the surface and subsurface voids of the EBC layer without having to deposit the nucleating agent into the voids after the EBC layer has been applied to a substrate. In some examples, such a process may allow for an EBC including a nucleating agent in at least some of the void space to be applied with, e.g., a thermal spray process used to apply an EBC without the need to an additional post coating process, e.g., to infiltrate the nucleating agent into void spaces of a previously formed EBC layer. Moreover, such a process may also provide for an increased amount of nucleating agent (e.g., approximately 100% of all void spaces in some cases) compared to other techniques, such as, slurry deposition techniques described herein. The complexities of the thermal spray process with the nucleating agent incorporated or otherwise attached to the fugitive material may allow the nucleating agent to occupy all voids but at the cost of producing an EBC that may have undesirable phases and microstructure. Other techniques including slurry deposition techniques description herein may allow for desirable EBC properties with the addition of the nucleating agent later.

FIG. 1 is a conceptual diagram illustrating an example article 10 including a substrate 12 and an EBC coating system 14. EBC coating system includes an optional bond coat 16 and EBC layer 18. In some examples, article 10 may include a component of a gas turbine engine. For example, article 10 may include a part that forms a portion of a flow path structure, a seal segment, a blade track, an airfoil, a blade, a vane, a combustion chamber liner, or another portion of a gas turbine engine. Although not shown in FIG. 1, EBC layer 18 includes a plurality of voids (e.g., pores, intercolumnar voids, cracks, and/or the like) within the layer, and a nucleating agent at least one of one the outer surface of the EBC layer or within at least some of the voids. As described herein, the nucleating agent within the voids may induce crystallization of molten CMAS, e.g., to form a barrier that prevents or otherwise reduces permeation of residual CMAS glass into the EBC.

Substrate 12 may include a material suitable for use in a high-temperature environment. In some examples, substrate 12 may include a ceramic or a ceramic matrix composite (CMC). Suitable ceramic materials, may include, for example, a silicon-containing ceramic, such as silica ($SiO_2$) and/or silicon carbide (SiC); silicon nitride ($Si_3N_4$); alumina ($Al_2O_3$); an aluminosilicate; a transition metal carbide (e.g., WC, $Mo_2C$, TiC); a silicide (e.g., $MoSi_2$, $NbSi_2$, $TiSi_2$); combinations thereof; or the like. In some examples in which substrate 12 includes a ceramic, the ceramic may be substantially homogeneous.

In examples in which substrate 12 includes a CMC, substrate 12 may include a matrix material and a reinforcement material. The matrix material may include, for example, silicon metal or a ceramic material, such as silicon carbide (SiC), silicon nitride ($Si_3N_4$), an aluminosilicate, silica ($SiO_2$), a transition metal carbide or silicide (e.g., WC, $Mo_2C$, TiC, $MoSi_2$, $NbSi_2$, $TiSi_2$), or another ceramic material. The CMC may further include a continuous or discontinuous reinforcement material. For example, the reinforcement material may include discontinuous whiskers, platelets, fibers, or particulates. Additionally, or alternatively, the reinforcement material may include a continuous monofilament or multifilament two-dimensional or three-dimensional weave, braid, fabric, or the like. In some examples, the reinforcement material may include carbon (C), silicon carbide (SiC), silicon nitride ($Si_3N_4$), an aluminosilicate, silica ($SiO_2$), a transition metal carbide or silicide (e.g. WC, $Mo_2C$, TiC, $MoSi_2$, $NbSi_2$, $TiSi_2$), or the like.

Substrate 12 may be manufactured using one or more techniques including, for example, chemical vapor deposition (CVD), chemical vapor infiltration (CVI), polymer impregnation and pyrolysis (PIP), slurry infiltration, melt infiltration (MI), combinations thereof, or other techniques.

EBC system 14 may help protect underlying substrate 12 from chemical species present in the environment in which article 10 is used, such as, e.g., water vapor, Calcium-Magnesium-Alumino-Silicate (CMAS; a contaminant that may be present in intake gases of gas turbine engines), or the like. Additionally, in some examples, EBC system 14 may also protect substrate 12 and provide for other functions besides that of an EBC, e.g., by functioning as a thermal barrier coating (TBC), abradable coating, erosion resistant coating, and/or the like.

As illustrated in FIG. 1, optional bond coat 16 of coating system 14 is on substrate 12. As used herein, "formed on" and "on" mean a layer or coating that is formed on top of another layer or coating, and encompasses both a first layer or coating formed immediately adjacent a second layer or coating and a first layer or coating formed on top of a second layer or coating with one or more intermediate layers or coatings present between the first and second layers or coatings. In contrast, "formed directly on" and "directly on" denote a layer or coating that is formed immediately adjacent another layer or coating, e.g., there are no intermediate layers or coatings. In some examples, as shown in FIG. 1, bond coat 16 of coating system 14 may be directly on substrate 12. In other examples, one or more coatings or layers of coatings may be between coating 16 of coating system 14 and substrate 12.

Bond coat 16 may be between EBC layer 18 and substrate 12 and may increase the adhesion of EBC layer 18 to substrate 12. In some examples, bond coat 16 may include silicon and take the form of a silicon bond layer. Bond coat 16 may be in direct contact with substrate 12 and EBC layer 18. In some examples, bond coat 16 has a thickness of approximately 25 microns to approximately 250 microns, although other thicknesses are contemplated.

In examples in which substrate 12 includes a ceramic or CMC, bond coat 16 may include a ceramic or another material that is compatible with the material from which substrate 12 is formed. For example, bond coat 16 may include mullite (aluminum silicate, $Al_6Si_2O_{13}$), silicon metal or alloy, silica, a silicide, or the like. Bond coat 16 may further include other elements, such as a rare earth silicate including a silicate of lutetium (Lu), ytterbium (Yb), thulium (Tm), erbium (Er), holmium (Ho), dysprosium (Dy), gadolinium (Gd), terbium (Tb), europium (Eu), samarium (Sm), promethium (Pm), neodymium (Nd), praseodymium (Pr), cerium (Ce), lanthanum (La), yttrium (Y), and/or scandium (Sc).

The composition of bond coat 16 may be selected based on the chemical composition and/or phase constitution of substrate 12 and the overlying layer (e.g., EBC layer 18 of FIG. 1). For example, if substrate 12 includes a ceramic or a CMC, bond coat 16 may include silicon metal or alloy or a ceramic, such as, for example, mullite.

In some cases, bond coat 16 may include multiple layers. For example, in some examples in which substrate 12 includes a CMC including silicon carbide, bond coat 16 may include a layer of silicon on substrate 12 and a layer of mullite, a rare earth silicate, or a mullite/rare earth silicate dual layer on the layer of silicon. In some examples, a bond coat 16 including multiple layers may provide multiple functions of bond coat 16, such as, for example, adhesion of substrate 12 to an overlying layer (e.g., EBC layer 18 of FIG. 1), chemical compatibility of bond coat 16 with each of substrate 12 and the overlying layer, a better coefficient of thermal expansion match of adjacent layers, or the like.

Bond coat 16 may be applied on substrate 12 using, for example, thermal spraying, e.g., air plasma spraying, high velocity oxy-fuel (HVOF) spraying, low vapor plasma spraying, suspension plasma spraying; physical vapor deposition (PVD), e.g., electron beam physical vapor deposition (EB-PVD), directed vapor deposition (DVD), cathodic arc deposition; chemical vapor deposition (CVD); slurry process deposition; sol-gel process deposition; electrophoretic deposition; or the like.

EBC system 14 includes EBC layer 18, which may be configured to help protect substrate 12 against deleterious environmental species, such as CMAS and/or water vapor. EBC layer 16 may include at least one of a rare-earth oxide, a rare-earth silicate, an aluminosilicate, or an alkaline earth aluminosilicate. For example, EBC 46 may include mullite, barium strontium aluminosilicate (BSAS), barium aluminosilicate (BAS), strontium aluminosilicate (SAS), at least one rare-earth oxide, at least one rare-earth monosilicate ($RE_2SiO_5$, where RE is a rare-earth element), at least one rare-earth disilicate ($RE_2Si_2O_7$, where RE is a rare-earth element), or combinations thereof. The rare-earth element in the at least one rare-earth oxide, the at least one rare-earth monosilicate, or the at least one rare-earth disilicate may include at least one of lutetium (Lu), ytterbium (Yb), thulium (Tm), erbium (Er), holmium (Ho), dysprosium (Dy), gadolinium (Gd), terbium (Tb), europium (Eu), samarium (Sm), promethium (Pm), neodymium (Nd), praseodymium (Pr), cerium (Ce), lanthanum (La), yttrium (Y), or scandium (Sc).

EBC layer 18 may be any suitable thickness. For example, EBC layer 18 may be about 0.005 inches (about 127 micrometers) to about 0.100 inches (about 2540 micrometers). In examples in which layer 18 is a non-abradable layer, layer 18 may have a thickness of about 0.001 inches (about 25.4 micrometers) to about 0.005 inches (about 127 micrometers). In other examples, layer 18 may have a different thickness.

Figure 2:
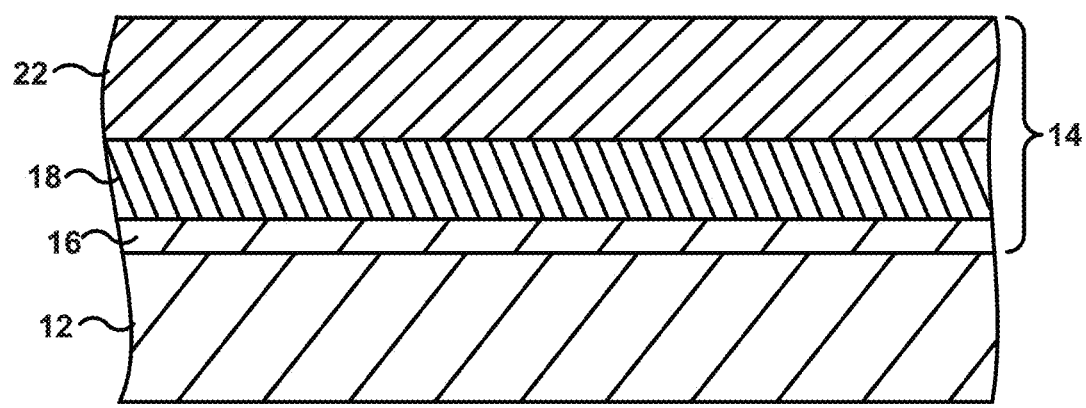
FIG. 2 is a conceptual diagram illustrating an example article including a substrate and a coating system including an abradable EBC layer and a nucleating agent.

FIG. 2 is a conceptual diagram illustrating another example article 20 including a substrate 12 and an EBC coating system 14. EBC coating system 14 and substrate 12 may be the same or substantially similar to that of EBC coating system 14 and substrate 12 of FIG. 1 and are similarly numbered. However, unlike that of article 10 shown in FIG. 1, coating system 14 includes abradable EBC layer 22 on EBC layer 18. In such a configuration, coating system 14 may be configured such that abradable EBC layer 22 has a greater porosity than EBC layer 18, and the porosity of abradable EBC layer 22 may be provided such that the outer surface of abradable EBC layer 22 is abraded, e.g., when brought into contact with an opposing surface such as a blade tip. Abradable EBC layer 22 may be on EBC layer 18, which may provide for better adhesion of abradable EBC layer 22 to optional bond layer 16 or substrate 12. In some examples, abradable EBC layer 22 may be about 0.005 inches (about 127 micrometers) to about 0.100 inches (about 2540 micrometers) thick. In other examples, layer 22 may have a different thickness.

Regardless of the composition or the thickness of EBC layer 18 or abradable EBC layer 22 of FIGS. 1 and 2, EBC layer 18 and abradable EBC layer 22 may include a plurality of voids. For example, EBC layer 18 and abradable EBC layer 22 may have a porous microstructure or a columnar microstructure. A porous microstructure may include a plurality of pores (e.g., voids) within the layer material, and a columnar microstructure may include columns of the layer material extending from the surface of a substrate (or another coating layer) with elongated intercolumnar voids. A porous or a columnar microstructure may improve the in-plane strain tolerance and/or the thermal cycle resistance of layers 18 and 22. In some examples, an average minimum dimension of the voids, such as, for example, an average minimum diameter of a pore of a porous microstructure, may be about 0.1 micrometers (μm) to about 20 μm.

In examples in which layers 18 and 22 have a porous microstructure, layer 18 or layer 22 may include a porosity of more than about 10 vol. %, such as more than about 20 vol. %, more than 30 vol. %, or more than about 40 vol. %, where porosity is measured as a percentage of pore volume divided by total volume of coating 16. When configured as a non-abradable layer, EBC layer 18 may include a porosity of more than about 1 vol. %, such as more than about 2 vol. %, more than 3 vol. %, or about 5 vol. % to about 10 vol. %, where porosity is measured as a percentage of pore volume divided by total volume of EBC layer 18. When configured as an abradable layer, abradable EBC layer 22 may include a porosity of more than about 15 vol. %, such as more than about 25 vol. %, more than 35 vol. %, or about 25 vol. % to about 45 vol. %, where porosity is measured as a percentage of pore volume divided by total volume of EBC layer 22. In each case, the porosity of layers 18 and 22 may be measured using mercury porosimetry, optical microscopy or Archimedean method.

In some examples, the porosity of EBC layers 18 and 22 may be created and/or controlled by plasma spraying the coating material using a co-spray process technique in which the coating material and a coating material additive are fed into a plasma stream with two radial powder feed injection ports. The feed pressures and flow rates of the coating material and coating material additive may be adjusted to inject the material on the outer edge of the plasma plume using direct 90-degree angle injection. This may permit the coating material particles to soften but not completely melt, and the coating material additive to not burn off, but rather soften sufficiently for adherence within coating 16.

In other examples, the porosity of EBC layers 18 and 22 may be controlled by the use of coating material additives and/or processing techniques to create the desired porosity. For example, to form an abradable layer such as EBC layer 22 of coating 14 in FIG. 2, a fugitive material that melts or burns at the use temperatures of the component (e.g., a blade track) may be incorporated into the coating material that forms EBC layer 22. The fugitive material may include, for example, graphite, hexagonal boron nitride, or a polymer such as a polyester, and may be incorporated into the coating material prior to deposition of the coating material on substrate 12 to form EBC layer 22. The fugitive material then may be melted or burned off in a post-formation heat treatment, or during operation of the gas turbine engine, to form pores in coating 16. The post-deposition heat-treatment may be performed at up to about 1500° C. for a component having a substrate 12 that includes a CMC or other ceramic. As will be described in further detail herein, in some example, a nucleating agent may be incorporated with the fugitive material during the application process such that the nucleating agent is left within the pores formed by burning out or otherwise removing the fugitive material from the EBC layer.

In other examples, the porosity of coating 16 may be created or controlled in a different manner, and/or coating 16 may be deposited on substrate 12 using a different technique. For example, coating 16 may be deposited using a wide variety of coating techniques, including, for example, a thermal spraying technique such as plasma spraying or suspension plasma spraying, physical vapor deposition (PVD) such as EB-PVD (electron beam physical vapor deposition) or DVD (directed vapor deposition), cathodic arc deposition, slurry process deposition, sol-gel process deposition, or combinations thereof.

In some examples in which EBC layer 18 or EBC layer 22 has a columnar microstructure, layer 18 or layer 22 may be deposited on substrate 12 using a suspension plasma spray technique, an EB-PVD technique, a plasma spray physical vapor deposition (PSPVD) technique, or a directed vapor deposition (DVD) technique. In some examples, layer 18 or layer 22 including a columnar microstructure may include a dense vertically cracked (DVC) coating, which in some cases, may be deposited on substrate 12 using an air plasma spray technique.

In one example, EBC layer 22 may be fabricated by thermally spraying a rare-earth (RE) disilicate powder or other suitable material blended with fugitive materials like polyester. The fugitive materials are then burnt out (e.g., at about 430° C.) of the abradable EBC layer 22 prior to or during engine service. The burn out results in a coating microstructure that has evenly distributed, relatively large pores allowing the turbine blade tips to readily cut into the EBC layer 22. Non-abradable EBC layers, such as, EBC layer 18 of FIG. 1 are fabricated in a similar fashion except no fugitive materials are blended with the powder and the resulting microstructure may contain significantly fewer pores. RE disilicates may be employed as the abradable and non-abradable EBC materials because they are thermally and chemically compatible with the underlying Si bond coat (e.g., bond coat 16) and possess good stability in high-temperature water vapor.

As noted above, under certain turbine operating conditions siliceous materials such as airborne dust, sand, fly ash and volcanic dust are ingested into the engine and accumulate on the hot surfaces of engine components (blade, vanes, combustion tiles and turbine segments) and melt when temperatures reach about 1200° C., depending on the composition of the deposit. Calcium Magnesium Alumino-Silicate (or CMAS) is the general name given to these molten deposits, as the predominant oxides are Calcia (CaO), Magnesia (MgO), Alumina ($Al_2O_3$) and Silica ($SiO_2$). RE disilicates are susceptible to CMAS attack where the disilicate dissolves in molten CMAS to form a crystalline apatite phase and residual CMAS glass. The residual CMAS glass further dissolves the disilicate by permeating along apatite and/or disilicate grain boundaries as well as through cracks and pores. This process may ultimately lead to partial or complete dissolution of the RE disilicate abradable and non-abradable EBC layers.

As described herein, in some examples, coating system 14 in FIGS. 1 and 2 also includes a nucleating agent 26, e.g., on the surface of EBC layer 18 and/or EBC layer 22 and/or within at least some voids of the plurality of voids of EBC layer 18 and/or EBC layer 22. Although such a configuration is not expressly illustrated in FIGS. 1 and 2, examples illustrating nucleating agent 26 within at least some voids of the plurality of voids will be described with respect to FIGS. 3A-4B.

In the absence of nucleating agents 26, the porous nature of EBC layer 18 and layer 22, particularly in the case of an abradable coating, may make EBC layer 18 and layer 22 vulnerable to CMAS attack as the porosity provides fast pathways for CMAS to infiltrate and dissolve the EBC layer as well as other underlying EBC layer(s) or substrate 12. The inclusion of nucleating agent(s) in EBC layer 18 and layer 22 provides for a CMAS resistant abradable or non-abradable EBC layer which does not require a fundamental change in coating chemistry but rather two different methods of introducing a nucleating agent to the coatings surface, surface/subsurface pores, and cracks that will promote crystallization of molten CMAS. The crystallization product(s) limit further infiltration of residual CMAS glass into EBC layer 18 and layer 22 as well as any other underlying EBC layer or substrate 12.

In some example, nucleating agent 26 includes a one or more of metal oxides (e.g., binary metal oxides such as $M_2O_3$, where M=metal and O=oxygen), RE titanites (where RE=rare earth element(s)), RE zirconates, RE halfnates, RE gallates, RE phosphates, and combinations thereof. Example metal oxides include $TiO_2$, RE oxides (e.g., $Yb_2O_3$, $Lu_2O_3$), $Y_2O_3$, $Sc_2O_3$, $ZrO_2$, $HfO_2$, $Ta_2O_5$, $Nb_2O_5$, $Cr_2O_3$. Examples of nucleating agent 26 may include CaO, MgO, $Al_2O_3$, RE monosilicate(s) (e.g., Yttrium monosilicate, Scandum monosilicate), RE phosphate(s) (e.g., Yttrium phosphate, Scandium phosphate), Calcium aluminate, Magnesium aluminate, Hafnium silicate, and/or Gadolinium zirconate.

In some examples, metal(s), metal alloys, and/or metal silicide(s) with a melting temperature over 1400 degrees Celsius may be used as nucleating agent, which oxidize to form a desired nucleating agent such as a metal oxide. Oxidation of the metal may lower the amount of oxygen that diffuses through the EBC coating to oxidize the bond coat. Nucleating agent 26 may react with CMAS to form a one or more of a variety of crystalline phases, which may depend on the particle nucleating agent and/or the composition of the CMAS. In some examples, nucleating agent 26 may react with CMAS to form a crystalline apatite phase. Nucleating agent 26 may be present as particulate. In some examples, nucleating agent 26 in particulate form may define a particle size (e.g., an average or a median particle diameter) from about 0.01 micrometers (μm) to about 25 μm, such as, about 0.01 μm to about 5 μm.

Nucleating agent 26 functions by reacting with molten CMAS to form a crystalline product(s) (e.g., crystalline apatite phase) that acts as a barrier between the residual CMAS glass and the abradable/non-abradable EBC layers. Nucleating agent 26 may function to initiate crystallization of CMAS, where the crystal phase effectively fills the voids at a certain level within the EBC to close the porosity or other void volume to further molten CMAS penetration. The nucleating agent may be dissolved/reacted with the molten CMAS and precipitate (nucleate and grow) a crystalline product. Example reactions may include $TiO_2$+CMAS to form paqueite $\{Ca_3TiSi_2(Al,Ti,Si)_3O_{14}\}$, diopside $\{Ca(Mg, Al)[(Si,Al)_2O_6]\}$ and/or $CaTiO_3$. A RE titanate+CMAS may form apatite $\{Ca_2RE_8(SiO_4)_6O_2\}$ and/or garnet $\{RE_6Mg_5Si_5O_{24}\}$. The crystal phase is more stable in molten CMAS and will not re-melt or react with CMAS during thermal cycling.

Nucleating agent 26 may be present within EBC layer 18 or layer 22 in an amount that induces a crystallization of CMAS in a sufficient amount to form crystalline product(s) that act as a barrier to residual molten CMAS further penetrating into the voids of EBC layer 18 or layer 22. Put another way, nucleating agent 26 may not induce crystallization of all molten CMAS present during operation in a high temperature environment but induces crystallization of enough of the molten CMAS to form a barrier in the void volume within the crystalline product(s) to prevent penetration of the remaining molten CMAS into the voids of EBC layer 18 or layer 22 beyond the crystalized barrier layer.

In some examples, binary metal oxides such as $TiO_2$ may induce crystallization of CMAS at temperatures of about 900 to about 1500° C., e.g., when present in EBC layer 18 or layer 22 in an amount of 20 wt % $TiO_2$ in a RE silicate EBC layer. RE titanates may also promote CMAS crystallization with the added advantages of forming a RE silicate and $TiO_2$ as reaction products. The $TiO_2$ reaction product may act as additional sites for heterogeneous nucleation where further crystallization of the CMAS can take place. RE zirconates effectively crystallize CMAS.

In some examples, nucleating agent 26 may be deposited as a layer on EBC layer 18 or layer 22. For example, in addition to, or as an alternative to, nucleating agent 26 being deposited within at least some voids of the plurality of voids of EBC layer 18 or layer 22, nucleating agent 26 may be deposited as a relatively thin layer on EBC layer 18 or layer 22. The relatively thin layer of nucleating agent may be substantially continuous (e.g., substantially continuously covering the outer surface of EBC layer 18 or layer 22) or may be a discontinuous layer (e.g., in cases in which respective nucleating agent particles are present at various discrete locations on the outer surface but do not cover the entire outer surface of EBC layer 18 or layer 22). In some examples, the layer including nucleating agent 26 may be on EBC layer 18 or layer 22 such that a surface of EBC layer 18 or layer 22 is substantially or fully covered by the layer of nucleating agent 26. In this way, a smaller amount of the surface of EBC layer 18 or layer 22 is exposed, which may further help protect EBC layer 18 or layer 22 and/or underlying substrate 12 from exposure to CMAS, water vapor, and/or other deleterious environmental species. In some examples, a layer of nucleating agent 26 on coating 16 may be relatively thin.

Nucleating agent 26 may be present on and/or in EBC layer 18 or layer 22 in any suitable amount that allow for nucleating agent 26 to function as described herein. For example, when present in at least a portion of the voids of EBC layer 18 or layer 22, nucleating agent 26 may be present in an amount of 0.001 wt % to 10 wt % of the combination of the EBC material of EBC layer 18 or EBC layer 22 and nucleating agent 26.

In some examples, the presence of particulates of nucleating agent 26 on the surface and/or inside the pores of EBC layer 18 or layer 22 does not compromise the overall abradability or other function of the EBC layer given the relatively small volume fraction of nucleating agent. Additionally, for the same reason, the higher coefficient of thermal expansion (CTE) of some example nucleating agents may not compromise the thermomechanical stability of EBC layer 18 or layer 22. In addition to effectively crystallizing CMAS, the nucleating agent may also be chemically compatible with the composition of EBC layer 18 or layer 22 (e.g., in the case of a RE disilicate-based EBC layer) and may possess sufficient thermochemical stability in high-temperature water vapor since about 10% water vapor is present in a gas turbine engine.

Nucleating agent 26 may be deposited on (or within at least some voids of) coating 16 by EB-PVD, suspension plasma spraying, sol-gel process deposition, slurry process deposition, or a vacuum infiltration technique. In some examples, suspension plasma spraying or sol-gel process deposition may be more effective at depositing nucleating agent 26 within at least some voids of coating 16 than some other deposition techniques. In other examples, nucleating agent 26 may be deposited on (or within at least some voids of) coating 16 using a technique other than EB-PVD, suspension plasma spraying, sol-gel process deposition, a slurry process deposition, or a vacuum infiltration technique.

As described herein, EBC layer 18 and EBC layer 22 each include a plurality of voids (e.g., pores or intercolumnar voids), and in some examples, nucleating agent 26 is deposited within at least some voids of the plurality of voids such that each respective void of the plurality of voids defines a void volume that is at least partially filled by nucleating agent 26.

Figure 3A:
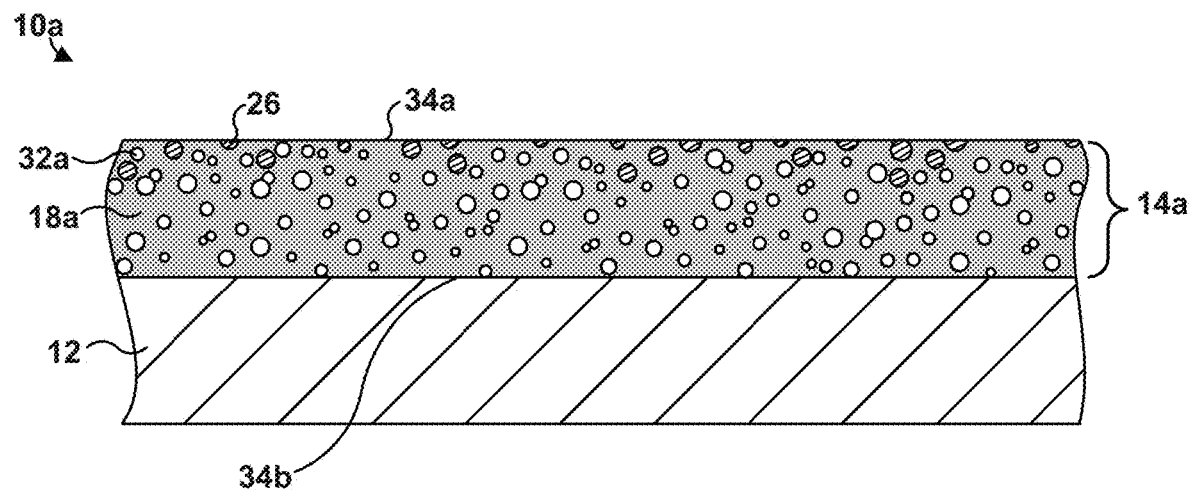
FIG. 3A is a conceptual diagram illustrating an example article including a substrate and an EBC layer with a porous microstructure and nucleating agent within at least some pores of the porous microstructure.

FIG. 3A is a conceptual diagram illustrating an example article 10a including a substrate 12 and a coating system 14a including a EBC layer 18a with a porous microstructure and nucleating agent 26 within at least some pores 32a of the porous microstructure. Article 10a may be the same or substantially the same as article 10 of FIG. 1 (bond coat 16 not shown for ease of illustration). In the example of FIG. 3A, coating 18a has a porous microstructure. The porous microstructure of coating 18a includes a plurality of pores 32a as the plurality of voids.

As seen in FIG. 3A, nucleating agent 26 is within at least some of the pores 32a. For example, each pore of the plurality of pores 32a may define a respective void volume (e.g., the volume of the respective pore 32a), and nucleating agent 26 may be within at least some of the respective void volumes. The plurality of pores 32a may include open porosity (e.g., a network of interconnected pores 32a) and/or closed porosity (e.g., a network of pores 32a that are not interconnected). In some examples, the at least some pores 32a including nucleating agent 26 may be along an outer surface 34a of EBC layer 18a (e.g., pores 32a open to outer surface 346a).

As described herein, plurality of pores 32a may define a respective void volume of EBC layer 18a such that EBC layer 18a has a porosity of about 1 percent (%) to about 50%, such as, about 1% to about 10%, or at least 25%. The size of respective pores of plurality of pores 32a may be about 0.1 µm to about 100 µm, such as, about 20 µm to about 60 µm. Nucleating agent 26 may be present within at least a portion of the void volume defined by plurality of pores 32a, e.g., as one or more particles within respective pores of the plurality of pores 32a. In some example, such nucleating agent particles may have a size of about 0.01 µm to about 25 µm, such as about 0.01 µm to about 5 µm. In some examples, nucleating agent 26 is a different material and phase compared to that of EBC layer 18a, and constitute particles that are a separate entity from the EBC layer 18a itself introduced into the pores or other void volumes.

Figure 3B:
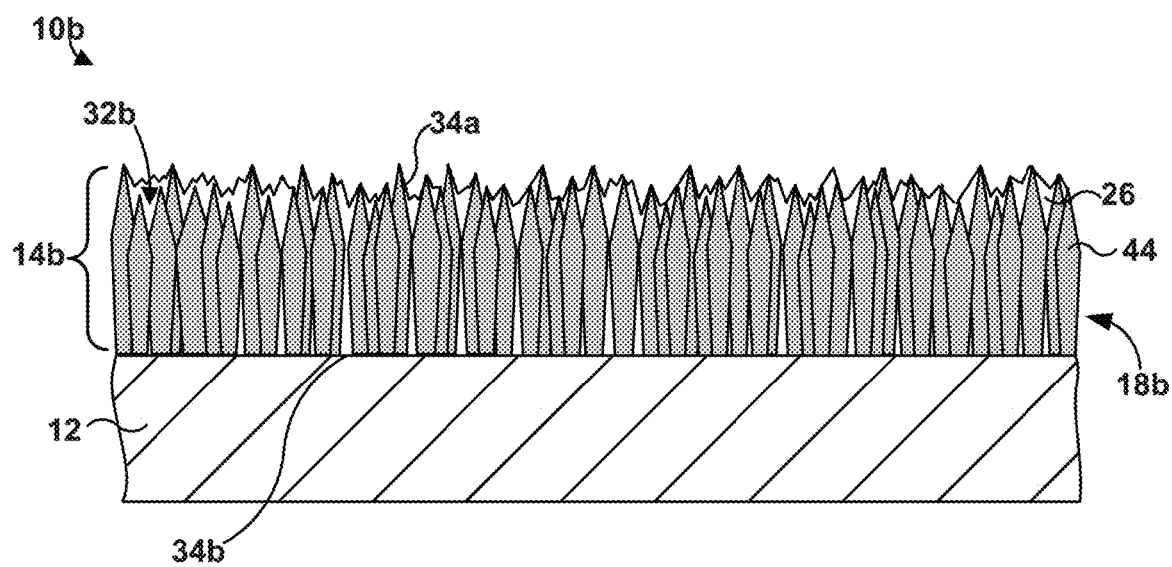
FIG. 3B is a conceptual diagram illustrating an example article including a substrate and an EBC layer with a columnar microstructure and nucleating agent within at least some intercolumnar voids of the columnar microstructure.

FIG. 3B is a conceptual diagram illustrating an example article 10b including a substrate 12 and a coating system 14b including a coating 16b with a columnar microstructure and nucleating agent 26 within at least some intercolumnar voids 32b of the columnar microstructure. Article 10b may be the same or substantially the same as article 10 of FIG. 1 (without bond coat 16 not shown for ease of illustration). In the example of FIG. 3B, coating 18b has a columnar microstructure. The columnar microstructure of coating 18b includes a plurality of columns 34 and a plurality of voids. In this case, the plurality of voids includes a plurality of intercolumnar voids 32b.

As seen in FIG. 3B, nucleating agent 26 is within at least some of the intercolumnar voids 32b. For example, each intercolumnar void of the plurality of intercolumnar voids 32b may define a respective void volume (e.g., the volume of the respective space between the respective surrounding columns 34), and nucleating agent 26 may be within at least some of the respective void volumes. In some examples, the at least some intercolumnar voids 32b including nucleating agent 26 may be along an outer surface 34b of EBC layer 18b. For example, in some cases, nucleating agent 26 may at least partially fill the respective void volumes of at least some of intercolumnar voids 32b along outer surface 34b, and nucleating agent 26 may fill fewer respective void volumes of intercolumnar voids 32b along an inner surface 34b of EBC layer 18b. As another example, nucleating agent 26 may fill less of the respective void volumes of intercolumnar voids 32b along inner surface 34b of EBC layer 18b in comparison to those along outer surface 34a.

In some examples, nucleating agent 26 does not fully fill any of the respective void volumes of the intercolumnar voids 32b or the pores 32a (collectively, "voids 32"). For example, nucleating agent 26 may fill about 0.1% to about 100% of each respective void volume in which nucleating agent 26 is present and/or cover about 0.1% to about 100% free surface area including pores, cracks, splat boundaries, and the like. In this way, each respective void volume of each voids 22 of the plurality of voids may not be fully filled. In turn, EBC layer 18a, 18b (collectively, "EBC layer 18") may still include a plurality of voids when coating system 14a, 14b (collectively, "coating system 14") includes nucleating agent 26. For example, the portion of each void 32 not filled by nucleating agent 26 may still be considered a void. Additionally, or alternatively, some voids 32 may not include nucleating agent 26. In other words, in some examples, nucleating agent 26 may only fill a portion of each respective void volume of a respective void 32, nucleating agent 26 may be within only a portion of the plurality of voids 32, or both.

For example, in some cases, nucleating agent 26 may at least partially fill the respective void volumes of at least some of voids 32 along outer surface 34a and nucleating agent 26 may fill fewer respective void volumes of voids 32 along an inner surface 34b of EBC layer 18. As another example, nucleating agent 26 may fill less of the respective void volumes of voids 34 along inner surface 34b of EBC layer 18 in comparison to those along outer surface 34a. In turn, coating system 14 may include a relatively porous or columnar structure, even with nucleating agent 26 within at least some voids 32 of the plurality of voids 32 of EBC layer 18, which may enable coating system 14 to protect against deleterious environmental species, have good thermal cycling performance, a low thermal conductivity, increased fracture toughness and mechanical strength, or the like.

Figure 4A:
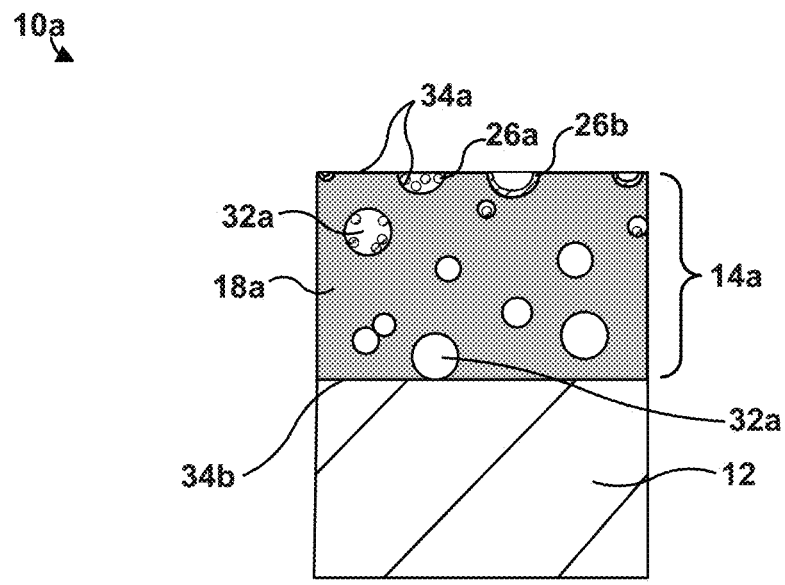
FIG. 4A is a conceptual diagram illustrating an enlarged view of the example article of FIG. 3A.
Figure 4B:
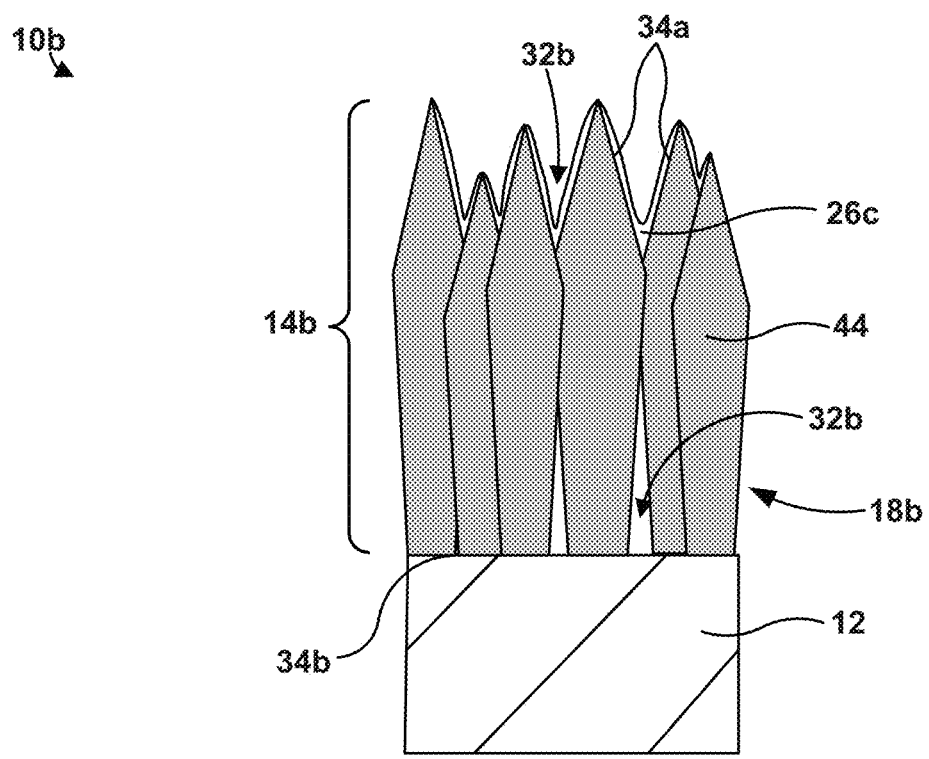
FIG. 4B is a conceptual diagram illustrating an enlarged view of the example article of FIG. 3B.

FIG. 4A is a conceptual diagram illustrating an enlarged view of the example article 10a of FIG. 3A. FIG. 4B is a conceptual diagram illustrating an enlarged view of the example article 10 of FIG. 3B. In some examples, as seen in FIGS. 3A and 3B, nucleating agent 26b, 26c may coat the outer surface 34a of EBC layer 18. In some examples, nucleating agent 26b, 26c forms a relatively thin layer on outer surface 34 of EBC layer 18 such that nucleating agent 26b, 26c follows the contour of EBC layer 18. For example, in the example of FIG. 4B, nucleating agent 26c is on EBC layer 18b such that nucleating agent 26c follows the shape of the individual columns 44 and intercolumnar voids 32b that create the contour of outer surface 34a. Similarly, in the example of FIG. 4A, nucleating agent 26b is on EBC layer 18a such that nucleating agent 26b follows the shape of outer surface 34a defined by EBC layer 18a and some of the pores 32a along outer surface 34a.

In addition to, or as an alternative to, nucleating agent 26b, 26c coating outer surface 34a of EBC layer 18, nucleating agent 26 may be within voids 32a, 32b without coating outer surface 34a of EBC layer 18. For example, as seen in FIG. 4A, nucleating agent 26a is disposed relatively loosely within a pore 32a of EBC layer 18a. In some such examples, particles of nucleating agent 26a may be freely within pore 32a of EBC layer 18a (e.g., not strongly adhered to pore 32a or outer surface 34a of layer 18a) and/or may be lightly attached at one or more portions of pore 32a or outer surface 34a.

In some examples, the configuration of nucleating agent 26 within voids 32 of layer 18 may depend on the technique used to deposit nucleating agent 26 within at least some voids 32 of the plurality of voids 32 of layer 18. Example techniques include EB-PVD and other vapor deposition techniques (e.g., DVD) may be used in addition or as an alternative to one or more slurry deposition processes. For example, an EB-PVD or DVD technique may result in nucleating agent 26b, 26c coating outer surface 34a of layer 18, and slurry process deposition may result in nucleating agent 26a being disposed relatively loosely within voids 32 of layer 18. Additionally, or alternatively, the size of the particles of nucleating agent 26 may determine the configuration of nucleating agent 26 within voids 32 of layer 18. For example, smaller particle sizes of nucleating agent 26 may result in nucleating agent 26b, 26c coating outer surface 34a of layer 18, and larger particle sizes of nucleating agent 26 may result in nucleating agent 26a being disposed relatively loosely within voids 32 of layer 18.

As illustrated in FIGS. 4A and 4B, nucleating agent 26 does not fully fill any of the respective void volumes of voids 32. For example, the thin layer or particles of nucleating agent 26 within voids 32 may fill about 0.1% to about 100% of the respective void volume and/or cover about 0.1% to about 100% free surface area including pores, cracks, splat boundaries, and the like. Additionally, or alternatively, in some cases, nucleating agent 26 may not be within all voids 32 of the plurality of voids. As a first example, in the example of FIG. 4B, nucleating agent 26 is not within intercolumnar voids 32b along inner surface 34b, and is only within intercolumnar voids 32b along outer surface 34a. As a second example, as seen in FIG. 4A, nucleating agent 26 is not within pores 32a along inner surface 34b, and is only within pores 32a along outer surface 34a. In other examples, nucleating agent 26 may be within a greater or a fewer number of voids 32 than illustrated in the examples of FIGS. 4A and 4B, or nucleating agent 26 may be present in additional or alternative locations than those illustrated in FIGS. 4A and 4B.

In some examples, such as when coating system 14 includes a layer including nucleating agent 26 on EBC layer 18, some voids 32 may be substantially filled by nucleating agent 26. For example, voids 32 along outer surface 34a of layer 18 may be substantially filled in order to apply nucleating agent 26 as a thin layer on layer 18. In some such cases, at least some other voids 32 may be only partially filled by nucleating agent 26, or may not include nucleating agent 26. In this way, EBC layer 18 may still include at least some voids 32 to preserve the columnar or porous microstructure of layer 18.

While the examples of FIGS. 3A-4B are primarily described with regard to nucleating agent 26 on an/or within pores of EBC layer 18 of FIG. 1, such description also applies to EBC layer 22, e.g., in the context of an abradable EBC layer 18. For example, EBC layer 22 may be substantially similar to that of EBC layer 18 in FIG. 1 but may have increased porosity to allow for EBC layer 22 to be abraded when contacted by an opposing surface, as described herein.

Figure 5:
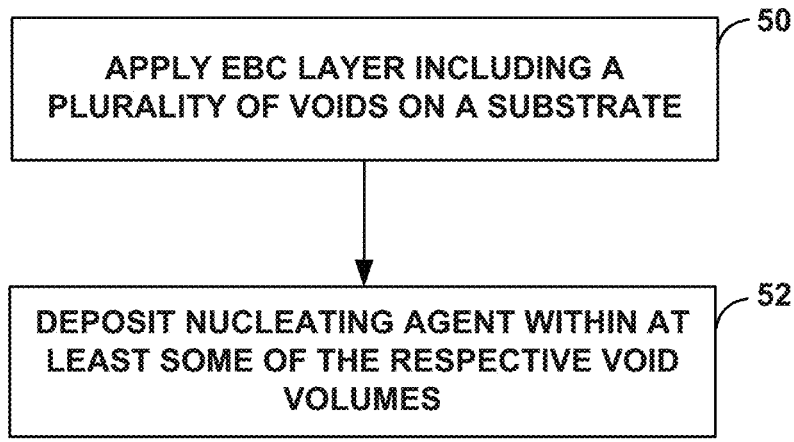
FIG. 5 is a flow diagram illustrating an example technique of forming an article including a substrate and a coating system including an EBC layer and a nucleating agent.

FIG. 5 is a flow diagram illustrating an example technique of forming an article including a substrate and an EBC coating system, wherein the coating system includes an EBC layer and nucleating agent. The technique of FIG. 5 will be described with respect to article 10 of FIG. 1. However, in other examples, the technique of FIG. 5 may be used to form articles other than article 10 of FIG. 1.

The technique of FIG. 5 includes applying EBC layer 18 including a plurality of voids 32 on substrate 12 (50). EBC layer 18 may be applied directly on substrate 12 or indirectly (e.g., by first applying optional bond coat 16 on substrate 12 followed by the application of EBC layer 18 onto bond coat 16, as shown in FIG. 1). In some examples, applying EBC layer 18 including a plurality of voids 32 may include applying EBC layer 18 having a porous microstructure including a plurality of pores (e.g., as seen in FIGS. 3A and 4A), applying coating 16 having a columnar microstructure including a plurality of columns and a plurality of intercolumnar voids (e.g., as seen in FIGS. 3B and 4B), or a combination thereof. As described herein, each void of the plurality of voids 32 of EBC layer 18 defines a respective void volume.

EBC layer 18 may be applied on substrate 12 using any one or more of a wide variety of coating techniques, including, for example, thermal spraying such as plasma spraying or suspension plasma spraying, physical vapor deposition (PVD) such as EB-PVD (electron beam physical vapor deposition) or DVD (directed vapor deposition), cathodic arc deposition, slurry process deposition, sol-gel process deposition, plasma spray physical vapor deposition (PSPVD), air plasma spraying, or combinations thereof. In some cases, the porosity of EBC layer 18 may be created and/or controlled by the technique used to apply layer 18 on substrate 12. For example, plasma spraying the coating material from which layer 18 is formed with a coating material additive and injecting the material on the outer edge of the plasma plume using direct 90-degree angle injection may be used to apply layer 18 including a porous microstructure. Additionally, or alternatively, the porosity of layer 18 may be controlled by the use of coating material additives and/or processing techniques to create the desired porosity. In other examples, the porosity of coating 16 may be created or controlled in a different manner. In some examples, a suspension plasma spray technique, an EB-PVD technique, a plasma spray physical vapor deposition (PSPVD) technique, or a directed vapor deposition (DVD) technique may be used to apply layer 18 on substrate 12 with a columnar microstructure.

The technique of FIG. 5 further includes depositing nucleating agent 26 within at least some of the respective void volumes of EBC layer 18 (52). Those respective void volumes may be surface or sub-surface void volumes of EBC layer 18. For example, nucleating agent 26 may be deposited within at least some voids of the plurality of voids 32 by at least one of EB-PVD (electron beam physical vapor deposition), sol-gel process deposition, slurry process deposition, a vacuum infiltration technique, or a suspension plasma spray technique.

In some examples, nucleating agent 26 may be deposited within at least some void volumes of respective voids 32 of EBC layer 18 using sol-gel process deposition, slurry process deposition, or a vacuum infiltration technique. In such examples, a solution including nucleating agent 26 and any additives or chemical agents may be formed, and the solution may be deposited within at least some voids of the plurality of voids 32. In some cases, the solution may include nucleating agent 26, a solvent, and/or one or more additives or chemical agents. In some examples, the solution, e.g., a slurry, may contain the nucleating agent 26, where the nucleating agent may be modified to meet CMAS resistance, thermomechanical and thermochemical requirements of EBC layer 18. For example, some nucleating agents may be very effective at crystallizing CMAS but may be relatively unstable in water vapor or are very hard and reduce the abradability of the coating. Therefore, a compromise may need to be made to find an acceptable nucleating agent that is stable in water vapor, won't affect the abradability of the EBC, and the like. In some examples, the solution may include of, but not limited to, cement (e.g., Nicrobraze) or solvent (e.g., water or ethyl alcohol).

In some examples, the solution may be painted or otherwise deposited onto the outer surface of EBC layer 18. In cases in which a vacuum infiltration technique is used to deposit nucleating agent 26 within at least some void volumes of respective voids 32, a vacuum may be pulled on article 10 including layer 18 to evacuate the pores. Then, a slurry, sol-gel, or another solution may be applied to article 10 under pressure such that the slurry, sol-gel, or another solution infiltrates and at least partially fills at least some voids 32 of layer 18.

Once the solution is deposited within at least some void volumes of respective voids of the plurality of voids 32, the article 10 may be dried, such as, for example, to remove a solvent or a chemical agent. Vacuum infiltration techniques may be utilized to provide for deposition of nucleating agent 26 into subsurface voids (e.g., subsurface pore network) of the plurality of voids 32 or deeper penetration of nucleating agent 26 into subsurface voids of the plurality of voids 32 compared to those techniques in which vacuum infiltration is not utilized. Vacuum infiltration of nucleating agent 26 may be employed, e.g., when the EBC layer is configured as an abradable layer such as in the case of abradable EBC layer 22 of FIG. 2.

Depositing nucleating agent 26 within at least some of the respective void volumes of respective voids of the plurality of voids 32 may include depositing nucleating agent 26 within at least some of the respective void volumes such that nucleating agent 26 does not fully fill any of the respective void volumes in which nucleating agent 26 is present. For example, nucleating agent 26 may be deposited within the respective void volumes such that nucleating agent 26 fills about 0.1% to about 100% of each respective void volume in which nucleating agent 26 is present and/or covers about 0.1% to about 100% free surface area including pores, cracks, splat boundaries, and the like. In turn, in some examples, nucleating agent 26 may only fill a portion of each respective void volume of a respective void 32, nucleating agent 26 18 may be within only a portion of the plurality of voids 32, or both. Thus, coating system 14 may include a relatively porous or columnar structure, even with nucleating agent 26 within at least some voids of the plurality of voids 32 of layer 18, which may enable coating system 14 to protect against deleterious environmental species, have good thermal cycling performance, a low thermal conductivity, increased fracture toughness and mechanical strength, or the like.

In some examples, the technique of FIG. 5 additionally includes applying nucleating agent 26 as a layer on EBC layer 18. For example, in addition to, or as an alternative to, nucleating agent 26 being deposited within at least some voids of the plurality of voids of EBC layer 18, nucleating agent 26 may be deposited as a relatively thin layer on EBC layer 18. In some examples, the layer including nucleating agent 26 may be on EBC layer 18 such that surface 34a of layer 18 is substantially or fully covered by the layer of nucleating agent 26, which may further help protect layer 18 and/or underlying substrate 12 from exposure to CMAS, water vapor, and/or other deleterious environmental species.

The technique of FIG. 5 may also be used to form article 20 of FIG. 2. For example, using the technique of FIG. 5, EBC layer 18 may be applied onto substrate 12 as described above (50). EBC layer 18 may be a non-abradable layer. Subsequently, abradable EBC layer 22 may be applied onto EBC layer 18, where EBC layer 22 includes a plurality of voids 32. In some examples, EBC layer 22 may be configured as an abradable layer by applying the EBC material along with a fugitive material, e.g., by thermal spraying the EBC material as a powder either pre-blended or co-sprayed with the fugitive material. As described above, once EBC layer 22 has been applied, the fugitive material may be removed, e.g., by heat treatment to melt or burn out the fugitive material to leave open pores within EBC layer 22. Once EBC layer 22 has been formed, nucleating agent 16 may be deposited within at some respective voids of the plurality of voids 32 in EBC layer 22, e.g., using the techniques described above (52).

Figure 6:
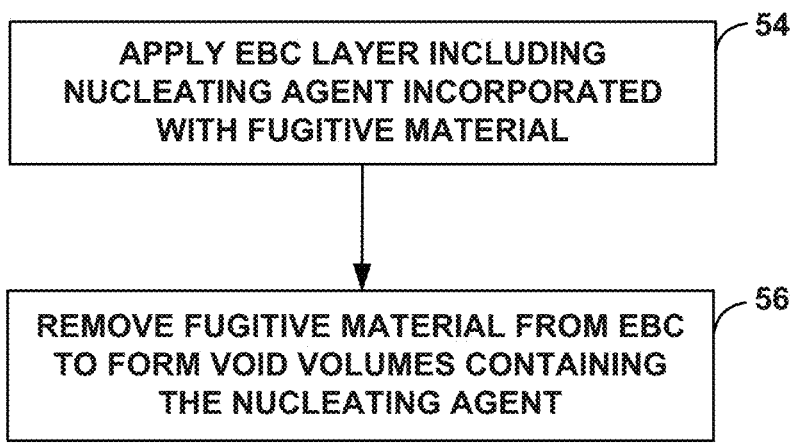
FIG. 6 is a flow diagram illustrating another example technique of forming an article including a substrate and a coating system including an EBC layer and a nucleating agent.

FIG. 6 is a flow diagram illustrating an example technique of forming an article including a substrate and an EBC coating system, wherein the coating system includes an EBC layer and nucleating agent. The technique of FIG. 5 will be described with respect to article 20 of FIG. 2. However, in other examples, the technique of FIG. 6 may be used to form articles other than article 20 of FIG. 2.

The technique of FIG. 6 may include utilizing the technique of FIG. 5 to apply EBC layer 18 onto substrate 12 (50) in the manner described above. Once EBC layer 18 is applied to substrate 12, abradable EBC layer 22 may be applied onto EBC layer 18. EBC layer 22 may be configured as an abradable layer by applying the EBC material along with a fugitive material (54), e.g., by thermal spraying the EBC material as a powder either pre-blended or co-sprayed with the fugitive material. In the example of FIG. 6, nucleating agent 26 may be incorporated into the fugitive material. For example, the fugitive material (e.g., polyester) may be fabricated to contain the nucleating agent (e.g., binary metal oxide), where the amount of nucleating agent 26 can be modified to meet CMAS resistance, thermomechanical and thermochemical requirements of the EBC layer 22.

Nucleating agent 26 may be incorporated into fugitive material using any suitable technique. For example, in the case of polyester for the fugitive material, nucleating agent in the form of a metal or metal oxide (e.g., binary metal oxide) may be incorporated into a polyester blend using, e.g., one or more of those techniques described in U.S. Pat. No. 4,547,536 to Nabors, the entire content of which is incorporated herein by reference. Other fugitive materials that may be incorporated with nucleating agent include epoxy, cement like Nicrobraz, graphite, and the like.

In such cases, once abradable EBC layer 22 is formed, the fugitive material may be heat treated or otherwise treated to remove the fugitive material from EBC layer 22 but not remove nucleating agent 26 incorporated with the fugitive material (56). Removing fugitive material from abradable layer 22 to form voids in the abradable EBC layer results in nucleating agent 26 incorporated with the fugitive material being located in those voids formed by the fugitive material. In some examples, additional nucleating material 26 may be deposited into abradable EBC layer 22 has been formed and the fugitive material has been removed, e.g., by using those nucleating material deposition techniques described with regard to FIG. 5.

As noted above, in some examples, the disclosure describes articles, systems, and techniques relating to a coating system for providing thermal insulation and/or an improved seal to a substrate and increased protection to the coating system against Calcium-Magnesium-Alumino-Silicate (CMAS), water vapor, and/or other deleterious environmental species. For ease of description, the below examples of FIGS. 7-10 are primarily described in the context of rare-earth metal phosphate as a nucleating agent in a TBC coating system including a plurality of voids. However, examples are not limited to such nucleating agents and/or TBC systems. For example, such description may apply to other examples coating systems (e.g., EBC and/or abradable coatings) and nucleating agents (e.g., one or more of the other examples nucleating agents described herein).

In some examples, the coating system includes a thermal barrier coating (TBC) and a rare-earth metal phosphate. In other examples, the coating system includes an abradable coating and a rare-earth metal phosphate. The rare-earth metal phosphate may be within at least some voids of a plurality of voids of the coating (e.g., TBC or abradable coating), may be present as a layer on the coating, or both. The rare-earth metal phosphate may increase the CMAS resistance of the coating system in comparison to some coating systems not including the rare-earth metal phosphate, e.g., by reacting with CMAS or components of CMAS and causing crystallization of CMAS, thus reducing further infiltration of molten CMAS into voids of the coating. In turn, the useful life of the component and/or the underlying substrate may be increased. Moreover, the rare-earth metal phosphate in the coating system may provide such CMAS resistance without substantially negatively effecting the erosion resistance, the thermal cycling capability, or the like of the coating system.

In some examples, substrates of high-temperature mechanical systems are coated with a TBC to reduce the substrate temperatures to meet the operational limits of the component. For example, a TBC may have a relatively low thermal conductivity to reduce the transfer of thermal energy from the high-temperature gases to the substrate. In some examples, a TBC may have a porous or a columnar microstructure (e.g., a microstructure including a plurality of voids) to obtain improved thermal cycling performance of the TBC. Deleterious environmental species, such as, for example, CMAS or water vapor, may penetrate the TBC (e.g., through the plurality of voids). The presence of a deleterious environmental species in the TBC may weaken or degrade the TBC layers, resulting in spalling of the TBC from the substrate, which may expose the substrate to higher temperatures and environmental species.

Additionally, or alternatively, substrates of high-temperature mechanical systems may be coated with an abradable coating to form a seal and reduce leakage. For example, as a turbine blade rotates, a tip of the turbine blade intentionally contacts the abradable coating and wears away a portion of the layer to form a groove in the abradable coating corresponding to the path of the turbine blade, which may reduce the gap between the turbine blade and the surrounding blade track or blade shroud. The intimate fit between the blade and abradable coating provides a seal, which may reduce or eliminate leakage of gas around the blade tip and increase the efficiency of the gas turbine engine by up to 5% in some cases. In some examples, an abradable layer may have a microstructure including a plurality of voids so that the abradable layer is more easily abraded by the blade tip. An abradable layer including a plurality of voids may also have improved thermal cycling performance. Similar to a TBC, deleterious environmental species may penetrate the abradable coating (e.g., through the plurality of voids), which may weaken or degrade the abradable coating layers, resulting in spalling of the abradable coating from the substrate.

While reducing the void fraction of a coating may reduce infiltration of deleterious environmental species into the coating, a coating with a lower void fraction may have reduced thermal cycling performance, increased thermal conductivity, or both in comparison to a coating including a higher void fraction.

In addition to, or as an alternative to changing the microstructure of the coating, the composition of the coating may be selected to help protect against infiltration of deleterious environmental species. For example, the effects of CMAS on the coating or the underlying substrate may be mitigated by inducing crystallization of the CMAS upon contact with or infiltration into voids in an outer portion of the coating through the inclusion of a relatively high concentration of one or more dopants in the composition of the coating. In some such examples, the dopants may include a rare-earth metal, aluminum, a rare-earth metal silicate, or combinations thereof. However, coatings including a relatively high concentration of one or more dopants may exhibit reduced erosion resistance in comparison to a coating that has a relatively low concentration of dopants or does not include any dopants configured to provide CMAS resistance. A coating with a relatively low erosion resistance may lead to mechanical damage, such as erosion by debris that enters the gas turbine engine or other high-temperature mechanical system in which the coating is utilized. Additionally, or alternatively, a rare-earth metal of a rare-earth metal silicate may help protect against deleterious environmental species, but silica may create a glass material upon reaction with CMAS or other deleterious environmental species. Therefore, the rare-earth silicate may both help resist against and react with deleterious environmental species, and the glass material forming reaction of the silica with the deleterious environmental species may offset the resistance provided the rare-earth metal of the rare-earth silicate.

The coating systems described herein include a coating with a plurality of voids and a rare-earth metal phosphate within at least some of the voids of the plurality of voids. For example, each respective void of the plurality of voids may define a respective void volume, and the rare-earth metal phosphate may be within at least some of the respective void volumes. In this way, the coating may include the plurality of voids to provide improved thermal cycling resistance and reduced thermal conductivity, and the rare-earth metal phosphate within the voids may help reduce infiltration of deleterious environmental species into the coating. Moreover, inclusion of the rare-earth metal phosphate within at least some of the respective void volumes may enable the coating to have an increased erosion resistance in comparison to coatings including one or more dopants configured to increase resistance of the coating to deleterious environmental species. In some examples, the rare-earth metal phosphate may provide increased resistance to CMAS and other deleterious environmental species without substantially reacting with the deleterious environmental species to create a glass material that may offset the resistance provided by the rare-earth metal.

Figure 7:
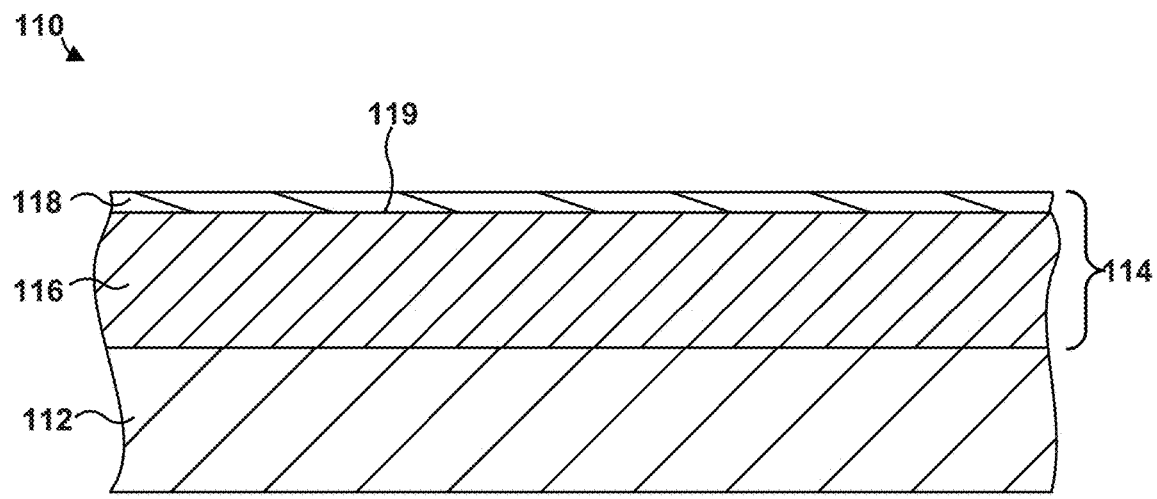
FIG. 7 is a conceptual diagram illustrating an example article including a substrate and a coating system including a coating and a rare-earth metal phosphate.

FIG. 7 is a conceptual diagram illustrating an example article 110 including a substrate 112 and a coating system 114 including a coating 116 and a rare-earth metal phosphate 118. In some examples, article 110 may include a component of a gas turbine engine. For example, article 110 may include a part that forms a portion of a flow path structure, a seal segment, a blade track, an airfoil, a blade, a vane, a combustion chamber liner, or another portion of a gas turbine engine.

Substrate 112 may include a material suitable for use in a high-temperature environment. In some examples, substrate 112 includes a superalloy including, for example, an alloy based on Ni, Co, Ni/Fe, or the like. In examples in which substrate 112 includes a superalloy material, substrate 112 may also include one or more additives such as titanium (Ti), cobalt (Co), or aluminum (Al), which may improve the mechanical properties of substrate 112 including, for example, toughness, hardness, temperature stability, corrosion resistance, oxidation resistance, or the like.

In some examples, substrate 112 may include a ceramic or a ceramic matrix composite (CMC). Suitable ceramic materials, may include, for example, a silicon-containing ceramic, such as silica ($SiO_2$) and/or silicon carbide (SiC); silicon nitride ($Si_3N_4$); alumina ($Al_2O_3$); an aluminosilicate; a transition metal carbide (e.g., WC, $Mo_2C$, TiC); a silicide (e.g., $MoSi_2$, $NbSi_2$, $TiSi_2$); combinations thereof; or the like. In some examples in which substrate 112 includes a ceramic, the ceramic may be substantially homogeneous.

In examples in which substrate 112 includes a CMC, substrate 112 may include a matrix material and a reinforcement material. The matrix material may include, for example, silicon metal or a ceramic material, such as silicon carbide (SiC), silicon nitride ($Si_3N_4$), an aluminosilicate, silica ($SiO_2$), a transition metal carbide or silicide (e.g., WC, $Mo_2C$, TiC, $MoSi_2$, $NbSi_2$, $TiSi_2$), or another ceramic material. The CMC may further include a continuous or discontinuous reinforcement material. For example, the reinforcement material may include discontinuous whiskers, platelets, fibers, or particulates. Additionally, or alternatively, the reinforcement material may include a continuous monofilament or multifilament two-dimensional or three-dimensional weave, braid, fabric, or the like. In some examples, the reinforcement material may include carbon (C), silicon carbide (SiC), silicon nitride ($Si_3N_4$), an aluminosilicate, silica ($SiO_2$), a transition metal carbide or silicide (e.g. WC, $Mo_2C$, TiC, $MoSi_2$, $NbSi_2$, $TiSi_2$), or the like.

As illustrated in FIG. 7, coating 116 of coating system 114 is on substrate 112. As used herein, "formed on" and "on" mean a layer or coating that is formed on top of another layer or coating, and encompasses both a first layer or coating formed immediately adjacent a second layer or coating and a first layer or coating formed on top of a second layer or coating with one or more intermediate layers or coatings present between the first and second layers or coatings. In contrast, "formed directly on" and "directly on" denote a layer or coating that is formed immediately adjacent another layer or coating, e.g., there are no intermediate layers or coatings. In some examples, as shown in FIG. 7, coating 116 of coating system 114 may be directly on substrate 112. In other examples, one or more coatings or layers of coatings may be between coating 116 of coating system 114 and substrate 112.

Coating 116 may include a TBC or an abradable coating. In any case, coating 16 may include any suitable composition. For example, coating 116 may include a composition to provide thermal cycling resistance, a low thermal conductivity, erosion resistance, combinations thereof, or the like. In some examples, coating 116 may include zirconia or hafnia stabilized with one or more metal oxides, such as one or more rare earth oxides, alumina, silica, titania, alkali metal oxides, alkali earth metal oxides, or the like. For example, coating 116 may include yttria-stabilized zirconia ($ZrO_2$) or yttria-stabilized hafnia, or zirconia or hafnia mixed with an oxide of one or more of lutetium (Lu), ytterbium (Yb), thulium (Tm), erbium (Er), holmium (Ho), dysprosium (Dy), gadolinium (Gd), terbium (Tb), europium (Eu), samarium (Sm), promethium (Pm), neodymium (Nd), praseodymium (Pr), cerium (Ce), lanthanum (La), yttrium (Y), or scandium (Sc).

As one example, coating 116 may include a rare earth oxide-stabilized zirconia or hafnia layer including a base oxide of zirconia or hafnia and at least one rare-earth oxide, such as, for example, at least one oxide of lutetium (Lu), ytterbium (Yb), thulium (Tm), erbium (Er), holmium (Ho), dysprosium (Dy), gadolinium (Gd), terbium (Tb), europium (Eu), samarium (Sm), promethium (Pm), neodymium (Nd), praseodymium (Pr), cerium (Ce), lanthanum (La), yttrium (Y), or scandium (Sc). In some such examples, coating 116 may include predominately (e.g., the main component or a majority) the base oxide including zirconia or hafnia mixed with a minority amount of the at least one rare-earth oxide.

In some examples, coating 116 may include the base oxide and a first rare earth oxide including ytterbium, a second rare earth oxide including samarium, and a third rare earth oxide including at least one of lutetium, scandium, cerium, neodymium, europium, or gadolinium. In some examples, the third rare earth oxide may include gadolinium such that the coating 116 may include zirconia, ytterbium, samarium, and gadolinium. In such examples, coating 116 may include predominately (e.g., the main component or a majority) the base oxide zirconia mixed with a minority amounts of ytterbium, samarium, and gadolinium. In some examples, the composition including zirconia, ytterbium, samarium, and gadolinium of coating 116 may provide improved thermal insulation and protection to substrate 112 from high temperatures, e.g., high-temperature of the turbine gas, compared to other coating compositions. For example, the composition including a base oxide of zirconia stabilized by oxides of ytterbium, samarium, and gadolinium may have a relatively low thermal conductivity. In turn, coating 116 may have improved thermal insulation, protection, thermal cycling resistance, or the like.

In some cases, the composition of coating 116 may be selected to provide a desired phase constitution. For example, coating 116 may be selected to provide a tetragonal prime (t') phase constitution, a cubic phase constitution, a compound phase constitution (e.g., $RE_2O_3$—$ZrO_2$ or $RE_2O_3$—$HfO_2$, where RE is a rare earth element), or combinations thereof. In some examples, the phase constitution may be determined using x-ray diffraction.

In some examples in which coating 116 is an abradable coating, coating 116 may include mullite, barium strontium aluminosilicate (BSAS), barium aluminosilicate (BAS), strontium aluminosilicate (SAS), at least one rare-earth oxide, at least one rare-earth monosilicate ($RE_2SiO_5$, where RE is a rare-earth element), at least one rare-earth disilicate ($RE_2Si_2O_7$, where RE is a rare-earth element), or combinations thereof. The rare-earth element in the at least one rare-earth oxide, the at least one rare-earth monosilicate, or the at least one rare-earth disilicate may include at least one of lutetium (Lu), ytterbium (Yb), thulium (Tm), erbium (Er), holmium (Ho), dysprosium (Dy), gadolinium (Gd), terbium (Tb), europium (Eu), samarium (Sm), promethium (Pm), neodymium (Nd), praseodymium (Pr), cerium (Ce), lanthanum (La), yttrium (Y), or scandium (Sc).

In some examples, coating 116 may include at least one rare-earth oxide and alumina, at least one rare-earth oxide and silica, or at least one rare-earth oxide, silica, and alumina. In some cases, coating 116 may include one or more additives. For example, coating 116 may include at least one of $TiO_2$, $Ta_2O_5$, $HfSiO_4$, an alkali metal oxide, or an alkali earth metal oxide. In some examples, the one or more additives may be added to coating 116 to modify one or more properties of coating 116. For example, the one or more additives may increase or decrease the reaction rate of the coating 116 with CMAS, modify the viscosity of the reaction product from a reaction of CMAS and coating 116, increase adhesion of the coating 116 to an underlying layer, increase or decrease the chemical stability of coating 116, or the like.

Coating 116 may be any suitable thickness. In examples in which coating 116 includes a TBC, coating 116 may have a thickness between about 0.001 inches and about 0.03 inches (e.g., between about 25 μm and about 7650 μm). For example, coating 116 may be between about 0.004 inches and about 0.015 inches (e.g., between about 100 μm and about 380 μm). In examples in which coating 116 includes an abradable coating, coating 116 may have a thickness of about 0.080 inches (e.g., about 2032 μm) or greater. In other examples, coating 116 may have a different thickness.

Regardless of the composition, the phase constitution, or the thickness of coating 116, coating 116 may include a plurality of voids. For example, coating 116 may have a porous microstructure or a columnar microstructure. A porous microstructure may include a plurality of pores (e.g., voids) within the coating material, and a columnar microstructure may include columns of the coating material extending from the surface of a substrate (or another coating layer) with elongated intercolumnar voids. A porous or a columnar microstructure may improve the in-plane strain tolerance and/or the thermal cycle resistance of coating 116. Additionally, or alternatively, a porous or a columnar microstructure may decrease the thermal conductivity of coating 116. In some examples, an average minimum dimension of the voids, such as, for example, an average minimum diameter of a pore of a porous microstructure, may be between about 1 μm and about 15 μm.

In examples in which coating 116 has a porous microstructure, coating 116 may include a porosity of more than about 10 vol. %, such as more than about 15 vol. %, more than 20 vol. %, or more than about 30 vol. %, where porosity is measured as a percentage of pore volume divided by total volume of coating 116. The porosity of coating 116 may be measured using mercury porosimetry or optical microscopy.

In some examples, the porosity of coating 116 may be created and/or controlled by plasma spraying the coating material using a co-spray process technique in which the coating material and a coating material additive are fed into a plasma stream with two radial powder feed injection ports. The feed pressures and flow rates of the coating material and coating material additive may be adjusted to inject the material on the outer edge of the plasma plume using direct 90-degree angle injection. This may permit the coating material particles to soften but not completely melt, and the coating material additive to not burn off, but rather soften sufficiently for adherence within coating 116.

In other examples, the porosity of coating 116 may be controlled by the use of coating material additives and/or processing techniques to create the desired porosity. For example, such as in examples in which coating 116 includes an abradable coating, a coating material additive that melts or burns at the use temperatures of the component (e.g., a blade track) may be incorporated into the coating material that forms coating 116. The coating material additive may include, for example, graphite, hexagonal boron nitride, or a polymer such as a polyester, and may be incorporated into the coating material prior to deposition of the coating material on substrate 112 to form coating 116. The coating material additive then may be melted or burned off in a post-formation heat treatment, or during operation of the gas turbine engine, to form pores in coating 116. The post-deposition heat-treatment may be performed at up to about 1150° C. for a component having a substrate 112 that includes a superalloy, or at up to about 1500° C. for a component having a substrate 112 that includes a CMC or other ceramic.

In other examples, the porosity of coating 116 may be created or controlled in a different manner, and/or coating 116 may be deposited on substrate 112 using a different technique. For example, coating 116 may be deposited using a wide variety of coating techniques, including, for example, a thermal spraying technique such as plasma spraying or suspension plasma spraying, physical vapor deposition (PVD) such as EB-PVD (electron beam physical vapor deposition) or DVD (directed vapor deposition), cathodic arc deposition, slurry process deposition, sol-gel process deposition, or combinations thereof.

In some examples in which coating 116 has a columnar microstructure, coating 116 may be deposited on substrate 112 using a suspension plasma spray technique, an EB-PVD technique, a plasma spray physical vapor deposition (PSPVD) technique, or a directed vapor deposition (DVD) technique. In some examples, coating 116 including a columnar microstructure may include a dense vertically cracked (DVC) coating, which in some cases, may be deposited on substrate 112 using an air plasma spray technique.

Coating system 114 also includes a rare-earth metal phosphate 118. In some examples, rare-earth metal phosphate 118 is within at least some voids of the plurality of voids of coating 116. Although such a configuration is not expressly illustrated in FIG. 7, examples illustrating rare-earth metal phosphate 118 within at least some voids of the plurality of voids will be described with respect to FIGS. 8A-9B.

Rare-earth metal phosphate 118 includes a phosphate of lutetium (Lu), ytterbium (Yb), thulium (Tm), erbium (Er), holmium (Ho), dysprosium (Dy), gadolinium (Gd), terbium (Tb), europium (Eu), samarium (Sm), promethium (Pm), neodymium (Nd), praseodymium (Pr), cerium (Ce), lanthanum (La), yttrium (Y), scandium (Sc), or combinations thereof (e.g., $REPO_4$, where RE represents a rare-earth metal). In some examples, rare-earth metal phosphate 118 may define a particle size (e.g., an average or a median particle diameter) between about 100 nanometers and about 1000 nanometers.

In some examples, rare-earth metal phosphate 118 includes a mixture of more than one rare-earth metal phosphate. For example, rare-earth metal phosphate 118 may include two or more rare-earth metal phosphates, where, in some cases, the two or more rare-earth metal phosphates may form two or more different phases. As one example, rare-earth metal phosphate 118 may include a monazite phase rare-earth metal phosphate and a xenotime phase rare-earth metal phosphate. A monazite phase rare-earth metal phosphate may be characterized by a space group of $P2_1n$, in which larger, lighter rare-earth metals are incorporated in a $REO_9$ polyhedron and the phosphate is incorporated in a $PO_4$ tetrahedron. A xenotime phase rare-earth metal phosphate may be characterized by a space group of $I4_1amd$, in which smaller, heavier rare-earth metals are incorporated in a $REO_8$ polyhedron and the phosphate is incorporated in a $PO_4$ tetrahedron. In both monazite phase and xenotime phase rare-earth metal phosphates, the $PO_4$ tetrahedra are separated from each other by the $REO_x$ polyhedra (e.g., where x is 9 for the monazite phase and 8 for the xenotime phase), and each oxygen atom is coordinated to two rare-earth metal atoms and one phosphorous atom.

In some examples, a monazite phase rare-earth metal phosphate may include at least one of lanthanum phosphate or cerium phosphate, and a xenotime phase rare-earth phosphate may include at least one of yttrium phosphate, dysprosium phosphate, ytterbium phosphate, or lutetium phosphate. In some examples, the monazite phase rare-earth phosphate and/or the xenotime rare-earth phosphate may include relatively small concentrations of one or more other rare-earth metals. For example, cerium phosphate may include cerium, as well as relatively small amounts of lanthanum, neodymium, praseodymium, and/or samarium. As another example, yttrium phosphate may include yttrium, as well as relatively small amounts of dysprosium, erbium, ytterbium, gadolinium, and/or holmium. In addition to, or as an alternative to, the relatively small concentrations of the one or more rare-earth metals, some monazite phase rare-earth phosphates and/or xenotime rare-earth phosphates may include relatively small concentrations of one or more other elements or compounds. For example, yttrium phosphate may include a relatively small amount of one or more silicates, such as a rare-earth metal silicate, and/or calcium.

In some examples, rare-earth metal phosphate 118 may include a greater amount of the monazite phase rare-earth metal phosphate than the xenotime phase rare-earth metal phosphate. The monazite phase rare-earth metal phosphate may have a coefficient of thermal expansion relatively close to a coefficient of thermal expansion of the material from which coating 116 is formed. For example, the monazite phase rare-earth metal phosphate may have a coefficient of thermal expansion of about 10.5 ppm/K, and zirconia from which coating 116 may be formed, may have a coefficient of thermal expansion of about 12 ppm/K.

In some examples, the xenotime phase rare-earth metal phosphate may be more effective in inducing crystallization of CMAS and other deleterious environmental species than the monazite phase rare-earth metal phosphate. Therefore, the xenotime phase rare-earth metal phosphate may better reduce or slow deleterious environmental species from infiltrating coating 116. However, the xenotime phase rare-earth metal phosphate may have a coefficient of thermal expansion less similar to the coefficient of thermal expansion of coating 116. For example, the xenotime phase rare-earth metal phosphate may have a coefficient of thermal expansion of about 6 ppm/K.

In this way, rare-earth metal phosphate 118 including a greater amount of the monazite phase rare-earth metal phosphate than the xenotime phase rare-earth metal phosphate may make an overall coefficient of thermal expansion (e.g., an effective coefficient of thermal expansion) of rare-earth metal phosphate 118 more similar to that of the material from which coating 116 is formed, thereby reducing the thermal expansion mismatch between rare-earth metal phosphate 118 and coating 116. In turn, the mechanical stability of rare-earth metal phosphate 118 and/or coating 116 may be improved, as fewer stresses may be exerted on coating 116 due to differential thermal expansion of rare-earth metal phosphate 118 and coating 116. Moreover, the adhesion between the rare-earth metal phosphate 118 and coating 116 may be improved due to the better match of the coefficients of thermal expansion of rare-earth metal phosphate 118 and coating 116. The presence of the xenotime phase rare-earth metal phosphate may provide increased resistance to deleterious environmental species in comparison to a rare-earth metal phosphate 118 that does not include a xenotime phase rare-earth phosphate. Thus, rare-earth metal phosphate 118 including a greater amount of the monazite phase rare-earth metal phosphate than the xenotime phase rare-earth metal phosphate may better match the coefficient of thermal expansion of coating 116, while also providing increased crystallization of deleterious environmental species and/or improved resistance to deleterious environmental species.

In some examples, rare-earth metal phosphate 118 may include one or more additives. For example, rare-earth metal phosphate 118 may include one or more of a rare-earth oxide (e.g., an oxide of yttrium, dysprosium, ytterbium, or lutetium), a rare-earth aluminate (e.g., an aluminate of yttrium, dysprosium, ytterbium, or lutetium), alumina, stabilized zirconia or hafnia, or the like. Such additives may be relatively effective in inducing crystallization of CMAS and other deleterious environmental species, and may have a coefficient of thermal expansion closer to that of material from which coating 116 is formed than the xenotime phase rare-earth metal phosphate. For example, the one or more additives may have a coefficient of thermal expansion of about 9 ppm/K. In this way, the addition of the one or more additives to rare-earth metal phosphate 118 may make the overall coefficient of thermal expansion of rare-earth metal phosphate 118 closer to the coefficient of thermal expansion of a material from which coating 116 is formed without negatively effecting the resistance of rare-earth metal phosphate 118 to deleterious environmental species. In some examples, the one or more additives may be added to rare-earth phosphate 118 as a nano-size or submicron-size powder.

In some cases, the one or more additives may be added to rare-earth metal phosphate 118 such that rare-earth metal phosphate 118 includes a monazite phase rare-earth metal phosphate, a xenotime rare-earth metal phosphate, and the one or more additives. In other cases, the one or more additives may be included in rare-earth metal phosphate 118 in place of the xenotime phase rare-earth metal phosphate. For example, rare-earth metal phosphate 118 may include the monazite phase rare-earth metal phosphate and the one or more additives. As another example, in some cases, rare-earth metal phosphate 118 including one or more additives may include less of the xenotime phase rare-earth metal phosphate than rare-earth metal phosphate 118 that does not include the one or more additives.

In some examples, rare-earth metal phosphate 118 may be deposited as a layer on coating 116. For example, in addition to, or as an alternative to, rare-earth metal phosphate 118 being deposited within at least some voids of the plurality of voids of coating 116, rare-earth metal phosphate 118 may be deposited as a relatively thin layer on coating 116, such as illustrated in FIG. 7. In some examples, the layer including rare-earth metal phosphate 118 may be on coating 116 such that a surface 119 of coating 116 is substantially or fully covered by the layer. In this way, a smaller amount of surface 119 of coating 116 is exposed, which may further help protect coating 116 and/or underlying substrate 112 from exposure to CMAS, water vapor, and/or other deleterious environmental species. In some examples, a layer of rare-earth metal phosphate 118 on coating 116 may be relatively thin.

Rare-earth metal phosphate 118 may be deposited on (or within at least some voids of) coating 116 by EB-PVD, suspension plasma spraying, sol-gel process deposition, slurry process deposition, or a vacuum infiltration technique. In some examples, suspension plasma spraying or sol-gel process deposition may be more effective at depositing rare-earth metal phosphate 118 within at least some voids of coating 116 than some other deposition techniques. In other examples, rare-earth metal phosphate 118 may be deposited on (or within at least some voids of) coating 116 using a technique other than EB-PVD, suspension plasma spraying, sol-gel process deposition, a slurry process deposition, or a vacuum infiltration technique.

Figure 8A:
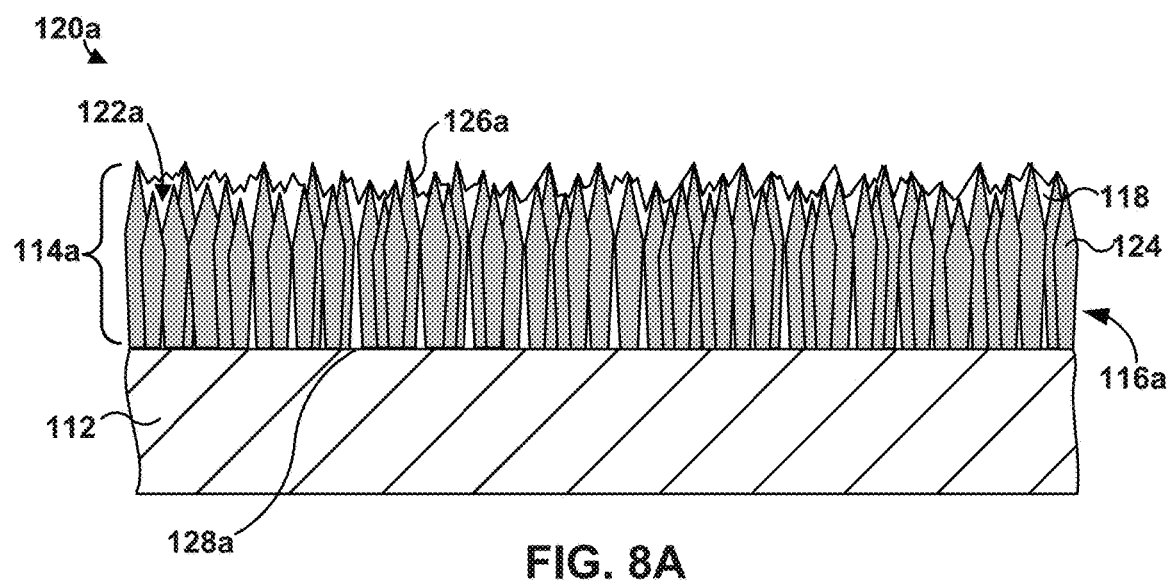
FIG. 8A is a conceptual diagram illustrating an example article including a substrate and a coating system including a coating with a columnar microstructure and rare-earth metal phosphate within at least some intercolumnar voids of the columnar microstructure.

As described above, coating 116 includes a plurality of voids (e.g., pores or intercolumnar voids), and in some examples, rare-earth metal phosphate 118 is deposited within at least some voids of the plurality of voids such that each respective void of the plurality of voids defines a void volume that is at least partially filled by rare-earth metal phosphate 118. FIG. 8A is a conceptual diagram illustrating an example article 120a including a substrate 112 and a coating system 114a including a coating 116a with a columnar microstructure and rare-earth metal phosphate 118 within at least some intercolumnar voids 122a of the columnar microstructure. Article 120a may be the same or substantially the same as article 110 of FIG. 7. In the example of FIG. 8A, coating 116a has a columnar microstructure. The columnar microstructure of coating 116a includes a plurality of columns 124 and a plurality of voids. In this case, the plurality of voids includes a plurality of intercolumnar voids 122a.

As seen in FIG. 8A, rare-earth metal phosphate 118 is within at least some of the intercolumnar voids 122a. For example, each intercolumnar void of the plurality of intercolumnar voids 122a may define a respective void volume (e.g., the volume of the respective space between the respective surrounding columns 124), and rare earth metal phosphate 118 may be within at least some of the respective void volumes. In some examples, the at least some intercolumnar voids 122a including rare-earth metal phosphate 118 may be along an outer surface 126a of coating 116a. For example, in some cases, rare-earth metal phosphate 118 may at least partially fill the respective void volumes of at least some of intercolumnar voids 122a along outer surface 126a, and rare-earth phosphate 118 may fill fewer respective void volumes of intercolumnar voids 122a along an inner surface 128a of coating 116a. As another example, rare-earth metal phosphate 118 may fill less of the respective void volumes of intercolumnar voids 122a along inner surface 128a of coating 116a in comparison to those along outer surface 126a.

Figure 8B:
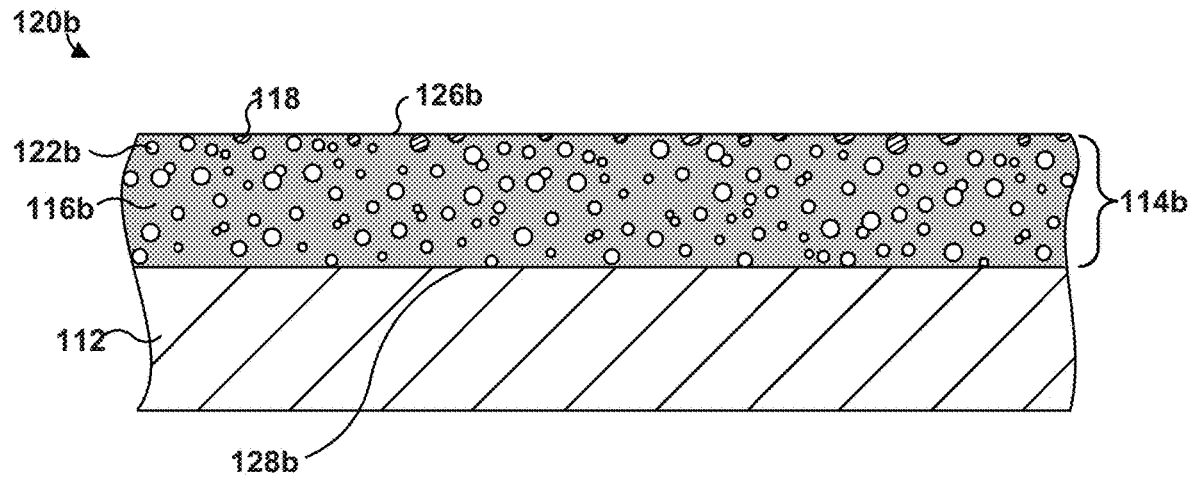
FIG. 8B is a conceptual diagram illustrating an example article including a substrate and a coating system including a coating with a porous microstructure and rare-earth metal phosphate within at least some pores of the porous microstructure.

FIG. 8B is a conceptual diagram illustrating an example article 120b including a substrate 112 and a coating system 114b including a coating 116b with a porous microstructure and rare-earth metal phosphate 118 within at least some pores 122b of the porous microstructure. Article 120b may be the same or substantially the same as article 110 of FIG. 7. In the example of FIG. 8B, coating 116b has a porous microstructure. The porous microstructure of coating 116b includes a plurality of pores 122b as the plurality of voids.

As seen in FIG. 8B, rare-earth metal phosphate 118 is within at least some of the pores 122b. For example, each pore of the plurality of pores 122b may define a respective void volume (e.g., the volume of the respective pore 122b), and rare earth metal phosphate 118 may be within at least some of the respective void volumes. The plurality of pores 122b may include open porosity (e.g., a network of interconnected pores 122b) and/or closed porosity (e.g., a network of pores 122b that are not interconnected). In some examples, the at least some pores 122b including rare-earth metal phosphate 118 may be along an outer surface 126b of coating 116b (e.g., pores 122b open to outer surface 126b).

In some examples, rare-earth metal phosphate 118 does not fully fill any of the respective void volumes of the intercolumnar voids 122a or the pores 122b (collectively, "voids 122"). For example, rare-earth metal phosphate 118 may fill between about 2% and about 90% of each respective void volume in which rare-earth metal phosphate 118 is present. In this way, each respective void volume of each void 122 of the plurality of voids may not be fully filled. In turn, coating 116a, 116b (collectively, "coating 116") may still include a plurality of voids when coating system 114a, 114b (collectively, "coating system 114") includes rare-earth metal phosphate 118. For example, the portion of each void 122 not filled by rare-earth metal phosphate 118 may still be considered a void. Additionally, or alternatively, some voids 122 may not include rare-earth metal phosphate 118. In other words, in some examples, rare-earth metal phosphate 118 may only fill a portion of each respective void volume of a respective void 122, rare-earth metal phosphate 118 may be within only a portion of the plurality of voids 122, or both.

For example, in some cases, rare-earth metal phosphate 118 may at least partially fill the respective void volumes of at least some of voids 122 along outer surface 126a, 126b and rare-earth phosphate 118 may fill fewer respective void volumes of voids 122 along an inner surface 128a, 128b of coating 116. As another example, rare-earth metal phosphate 118 may fill less of the respective void volumes of voids 122 along inner surface 128a, 128b of coating 116 in comparison to those along outer surface 126a, 126b. In turn, coating system 114 may include a relatively porous or columnar structure, even with rare-earth metal phosphate 118 within at least some voids 122 of the plurality of voids 122 of coating 116, which may enable coating system 114 to protect against deleterious environmental species, have good thermal cycling performance, a low thermal conductivity, increased fracture toughness and mechanical strength, or the like.

Figure 9A:
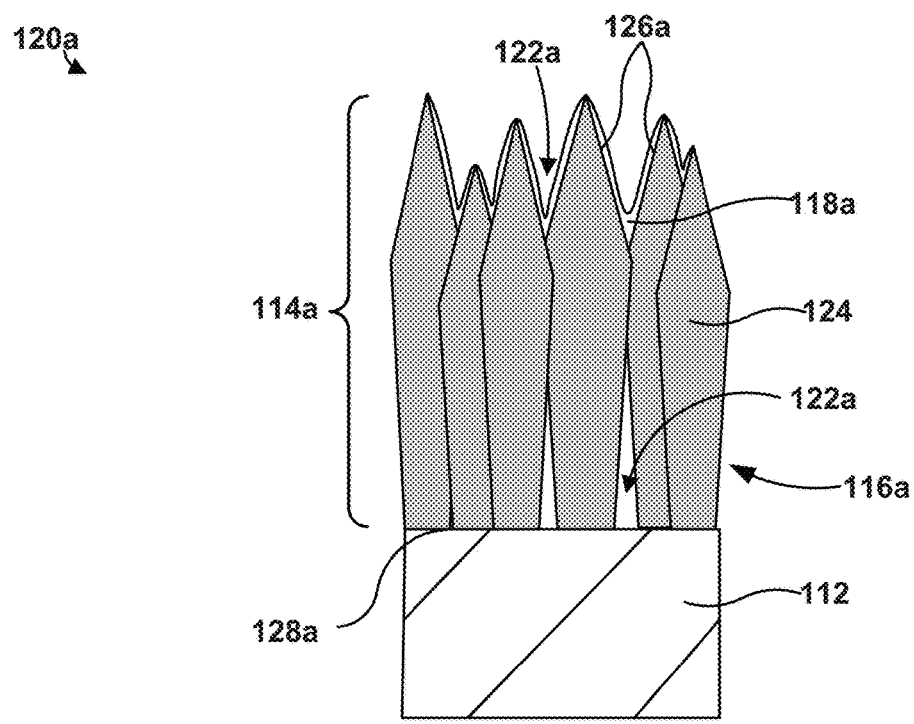
FIG. 9A is a conceptual diagram illustrating an enlarged view of the example article of FIG. 8A.
Figure 9B:
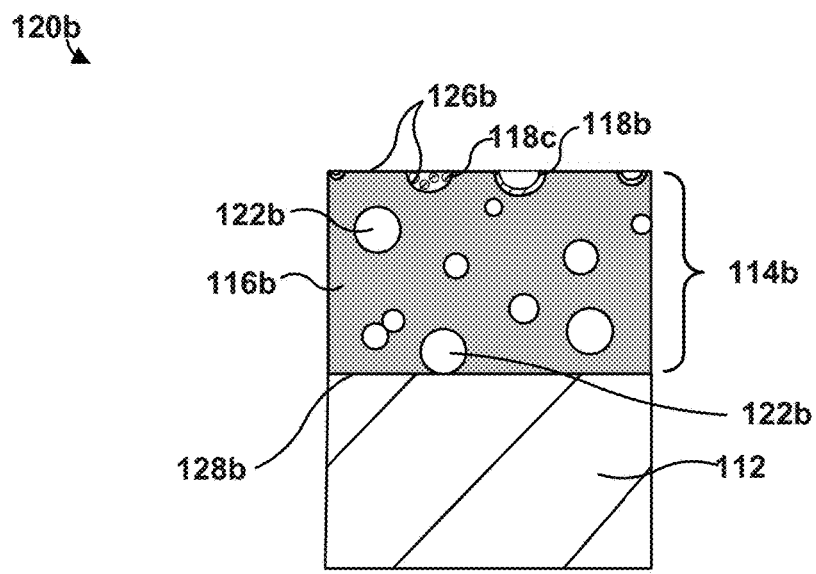
FIG. 9B is a conceptual diagram illustrating an enlarged view of the example article of FIG. 8B.

FIG. 9A is a conceptual diagram illustrating an enlarged view of the example article 120a of FIG. 8A. FIG. 9B is a conceptual diagram illustrating an enlarged view of the example article 120b of FIG. 8B. In some examples, as seen in FIGS. 9A and 9B, rare-earth metal phosphate 118a, 118b may coat the outer surface 126a, 126b (collectively, "outer surface 126") of coating 116. In some examples, rare-earth metal phosphate 118a, 118b forms a relatively thin layer on outer surface 126 of coating 116 such that rare-earth metal phosphate 118a, 118b follows the contour of coating 116. For example, in the example of FIG. 9A, rare-earth metal phosphate 118a is on coating 116a such that rare-earth metal phosphate 118a follows the shape of the individual columns 124 and intercolumnar voids 122a that create the contour of outer surface 126a. Similarly, in the example of FIG. 9B, rare-earth metal phosphate 118b is on coating 116b such that rare-earth metal phosphate 118b follows the shape of outer surface 126b defined by coating 116b and some of the pores 122b along outer surface 126b.

In addition to, or as an alternative to, rare-earth metal phosphate 118a, 118 b coating outer surface 126 of coating 116, rare-earth metal phosphate 118 may be within voids 122a, 122b without coating outer surface 126 of coating 116. For example, as seen in FIG. 9B, rare-earth metal phosphate 118c is disposed relatively loosely within a pore 122b of coating 116b. In some such examples, particles of rare-earth metal phosphate 118c may be freely within pore 122b of coating 116b (e.g., not strongly adhered to pore 122b or outer surface 126b of coating 116b) and/or may be lightly attached at one or more portions of pore 122b or outer surface 126b.

In some examples, the configuration of rare-earth metal phosphate 118 within voids 122 of coating 116 may depend on the technique used to deposit rare-earth metal phosphate 118 within at least some voids 122 of the plurality of voids 122 of coating 116. For example, an EB-PVD technique may result in rare-earth metal phosphate 118a, 118b coating outer surface 126 of coating 116, and slurry process deposition may result in rare-earth metal phosphate 118c being disposed relatively loosely within voids 122 of coating 116. Additionally, or alternatively, the size of the particles of rare-earth metal phosphate 118 may determine the configuration of rare-earth metal phosphate 118 within voids 122 of coating 116. For example, smaller particle sizes of rare-earth metal phosphate may result in rare-earth metal phosphate 118a, 118b coating outer surface 126 of coating 116, and larger particle sizes of rare-earth metal phosphate 118 may result in rare-earth metal phosphate 118c being disposed relatively loosely within voids 122 of coating 116.

As illustrated in FIGS. 9A and 9B, rare-earth metal phosphate 118 does not fully fill any of the respective void volumes of voids 122. For example, the thin layer or particles of rare-earth metal phosphate 118 within voids 122 may fill between about 2% and about 90% of the respective void volume. Additionally, or alternatively, in some cases, rare-earth metal phosphate 118 may not be within all voids 122 of the plurality of voids. As a first example, in the example of FIG. 9A, rare-earth metal phosphate 118 is not within intercolumnar voids 122a along inner surface 128a, and is only within intercolumnar voids 122a along outer surface 126a. As a second example, as seen in FIG. 9B, rare-earth metal phosphate 118 is not within pores 122b along inner surface 128b, and is only within pores 122b along outer surface 126b. In other examples, rare-earth metal phosphate 118 may be within a greater or a fewer number of voids 122 than illustrated in the examples of FIGS. 9A and 9B, or rare-earth metal phosphate 118 may be present in additional or alternative locations than those illustrated in FIGS. 9A and 9B.

In some examples, such as when coating system 114 includes a layer including rare-earth metal phosphate 118 on coating 116, some voids 122 may be substantially filled by rare-earth metal phosphate 118. For example, voids 122 along outer surface 126 of coating 116 may be substantially filled in order to apply rare-earth metal phosphate 118 as a thin layer on coating 116. In some such cases, at least some other voids 122 may be only partially filled by rare-earth metal phosphate 118, or may not include rare-earth metal phosphate 118. In this way, coating 116 may still include at least some voids 122 to preserve the columnar or porous microstructure of coating 116 to provide increased thermal cycling resistance, a low thermal conductivity, or the like.

In some cases, a thinner coat of rare-earth metal phosphate 118a, 118b within at least some voids 122 of coating 116 or a smaller amount of rare-earth metal phosphate 118c relatively loosely disposed within at least some voids 122 of coating 116 may include a greater amount of a xenotime phase rare-earth metal phosphate in comparison to a thicker coat of rare-earth metal phosphate 118a, 118b within at least some voids 122 or a larger amount of rare-earth metal phosphate 118c relatively loosely disposed within at least some voids 122. For example, a coefficient of thermal expansion mismatch between coating 116 and rare-earth metal phosphate 118a, 118b of a thinner coating of rare-earth metal phosphate 118a, 118b may have a smaller effect on coating system 114 than the effect of a coefficient of thermal expansion mismatch of a thicker coating. In some examples, a thin coating of rare-earth metal phosphate 118 including a greater amount of a xenotime phase rare-earth metal phosphate may have a lower overall or effective coefficient of thermal expansion without significantly negatively affecting coating system 114, and may have increased resistance to deleterious environmental species in comparison to a thicker coating or a thin coating including a lesser amount of the xenotime phase rare-earth metal phosphate. Similarly, a smaller amount of rare-earth metal phosphate 118 including a greater amount of a xenotime phase rare-earth metal phosphate relatively loosely disposed within voids 122 may have a lower overall or effective coefficient of thermal expansion without significantly negatively affecting coating system 114, and may have increased resistance to deleterious environmental species in comparison to a larger amount or a smaller amount including a lesser amount of the xenotime phase rare-earth metal phosphate.

Figure 10:
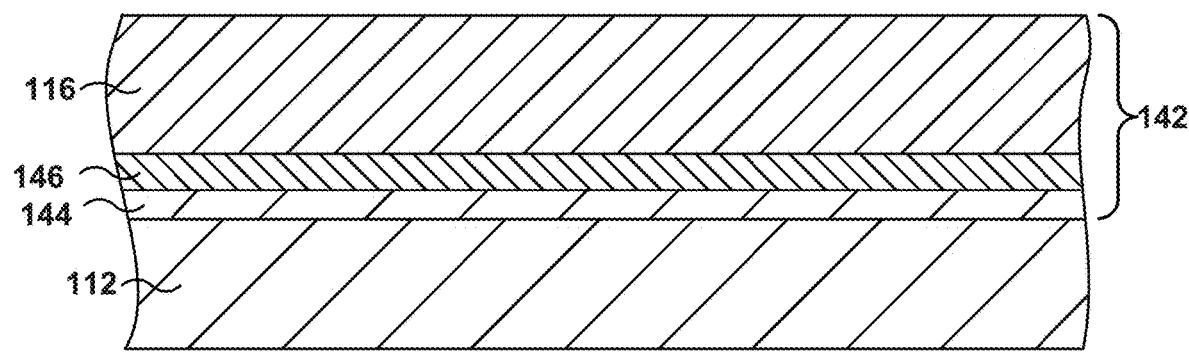
FIG. 10 is a conceptual diagram illustrating an example article including a substrate and a coating system including a bond coat, an environmental barrier coating (EBC), a coating, and a rare-earth metal phosphate.

FIG. 10 is a conceptual diagram illustrating an example article 140 including a substrate 112 and a coating system 142 including a bond coat 144, an environmental barrier coating (EBC) 146, coating 116, and at least one rare-earth metal phosphate. In some examples, a coating system may include one or more layers in addition to coating 116 to provide one or more additional or alternative properties to the coating system. For example, as seen in FIG. 10, coating system 142 includes bond coat 144 and EBC 146 in addition to coating 116 and at least one rare-earth metal phosphate. At least one rare-earth metal phosphate may be disposed within voids of coating 116, as described above.

Bond coat 144 may improve adhesion between substrate 112 and an overlying layer, such as EBC 146. Bond coat 144 may include any suitable material configured to improve adhesion between substrate 112 and EBC 146. In some examples, an article may include additional layers between bond coat 144 and EBC 146, or an article may not include EBC 146. In such examples, the composition of bond coat 144 may be selected to increase adhesion between substrate 112 and the layer that is on bond coat 144.

In examples in which substrate 112 includes a superalloy, bond coat 144 may include an alloy, such as an MCrAlY alloy (where M is Ni, Co, or NiCo), a β-NiAl nickel aluminide alloy (either unmodified or modified by Pt, Cr, Hf, Zr, Y, Si, and combinations thereof), a γ-Ni+γ'-Ni$_3$Al nickel aluminide alloy (either unmodified or modified by Pt, Cr, Hf, Zr, Y, Si, and combination thereof), or the like.

In examples in which substrate 112 includes a ceramic or CMC, bond coat 144 may include a ceramic or another material that is compatible with the material from which substrate 112 is formed. For example, bond coat 144 may include mullite (aluminum silicate, Al$_6$Si$_2$O$_{13}$), silicon metal or alloy, silica, a silicide, or the like. Bond coat 144 may further include other elements, such as a rare earth silicate including a silicate of lutetium (Lu), ytterbium (Yb), thulium (Tm), erbium (Er), holmium (Ho), dysprosium (Dy), gadolinium (Gd), terbium (Tb), europium (Eu), samarium (Sm), promethium (Pm), neodymium (Nd), praseodymium (Pr), cerium (Ce), lanthanum (La), yttrium (Y), and/or scandium (Sc).

In some examples, the composition of bond coat 144 may be selected based on the chemical composition and/or phase constitution of substrate 112 and the layer overlying bond coat 144 (e.g., EBC 146 of FIG. 10). For example, if substrate 112 includes a superalloy with a γ-Ni+γ'-Ni$_3$Al phase constitution, bond coat 144 may include a γ-Ni+γ'-Ni$_3$Al phase constitution to better match the coefficient of thermal expansion of the superalloy substrate 112. In turn, the mechanical stability (e.g., adhesion) of bond coat 144 to substrate 112 may be increased. In other examples, if substrate 112 includes a ceramic or a CMC, bond coat 144 may include silicon metal or alloy or a ceramic, such as, for example, mullite.

In some cases, bond coat 144 may include multiple layers. For example, in some examples in which substrate 112 includes a CMC including silicon carbide, bond coat 144 may include a layer of silicon on substrate 112 and a layer of mullite, a rare earth silicate, or a mullite/rare earth silicate dual layer on the layer of silicon. In some examples, a bond coat 144 including multiple layers may provide multiple functions of bond coat 144, such as, for example, adhesion of substrate 112 to an overlying layer (e.g., EBC 146 of FIG. 10), chemical compatibility of bond coat 144 with each of substrate 112 and the overlying layer, a better coefficient of thermal expansion match of adjacent layers, or the like.

Bond coat 144 may be applied on substrate 112 using, for example, thermal spraying, e.g., air plasma spraying, high velocity oxy-fuel (HVOF) spraying, low vapor plasma spraying, suspension plasma spraying; physical vapor deposition (PVD), e.g., electron beam physical vapor deposition (EB-PVD), directed vapor deposition (DVD), cathodic arc deposition; chemical vapor deposition (CVD); slurry process deposition; sol-gel process deposition; electrophoretic deposition; or the like.

In some examples, coating system 142 includes EBC 146 configured to help protect against deleterious environmental species, such as CMAS and/or water vapor. EBC 146 may include at least one of a rare-earth oxide, a rare-earth silicate, an aluminosilicate, or an alkaline earth aluminosilicate. For example, EBC 146 may include mullite, barium strontium aluminosilicate (BSAS), barium aluminosilicate (BAS), strontium aluminosilicate (SAS), at least one rare-earth oxide, at least one rare-earth monosilicate (RE$_2$SiO$_5$, where RE is a rare-earth element), at least one rare-earth disilicate (RE$_2$Si$_2$O$_7$, where RE is a rare-earth element), or combinations thereof. The rare-earth element in the at least one rare-earth oxide, the at least one rare-earth monosilicate, or the at least one rare-earth disilicate may include at least one of lutetium (Lu), ytterbium (Yb), thulium (Tm), erbium (Er), holmium (Ho), dysprosium (Dy), gadolinium (Gd), terbium (Tb), europium (Eu), samarium (Sm), promethium (Pm), neodymium (Nd), praseodymium (Pr), cerium (Ce), lanthanum (La), yttrium (Y), or scandium (Sc).

In some examples, EBC 146 may include at least one rare-earth oxide and alumina, at least one rare-earth oxide and silica, or at least one rare-earth oxide, silica, and alumina. In some cases, EBC 146 may include one or more additives. For example, EBC 146 may include at least one of TiO$_2$, Ta$_2$O$_5$, HfSiO$_4$, an alkali metal oxide, or an alkali earth metal oxide. In some examples, the one or more additives may be added to EBC 146 to modify one or more properties of EBC 146. For example, the one or more additives may increase or decrease the reaction rate of the EBC 146 with CMAS, modify the viscosity of the reaction product from a reaction of CMAS and EBC 146, increase adhesion of the EBC 146 to bond coat 144 and/or coating 116, increase or decrease the chemical stability of EBC 146, or the like.

In some examples, EBC 146 may be substantially free (e.g., free or nearly free) of hafnia and/or zirconia. Zirconia and hafnia may be susceptible to chemical attack by CMAS, so an EBC substantially free of hafnia and/or zirconia may be more resistant to CMAS attack than an EBC that includes zirconia and/or hafnia. EBC 146 may be a substantially dense layer, e.g., may include a porosity of less than about 10 vol. %, measured as a fraction of open space compared to the total volume of the EBC 146 using, for example, mercury porosimetry or optical microscopy.

In some examples, coating system 142 may include one or more additional or alternative layers, or one or more layers illustrated in FIG. 10 may not be included in coating system 142. For example, in some cases, coating system 142 may include an abradable layer in addition to bond coat 144, EBC 146, and coating 116. Moreover, the layers of coating system 142 may be on substrate 112 in any suitable order.

Figure 11:
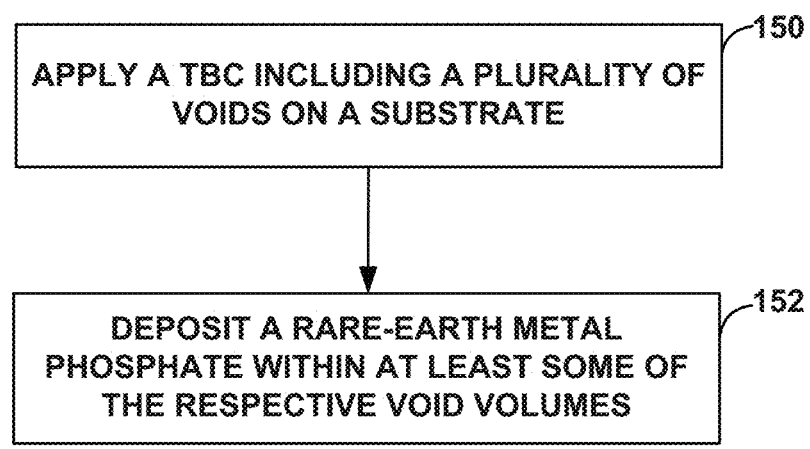
FIG. 11 is a flow diagram illustrating an example technique of forming an article including a substrate and a coating system including a coating and a rare-earth metal phosphate.

FIG. 11 is a flow diagram illustrating an example technique of forming an article including a substrate and a coating system including a coating and a rare-earth metal phosphate. The technique of FIG. 11 will be described with respect to article 110 of FIG. 7. However, in other examples, the technique of FIG. 11 may be used to form articles other than article 110 of FIG. 7.

The technique of FIG. 11 includes applying coating 116 including a plurality of voids 122 on substrate 112 (150). Coating 116 may include a TBC or an abradable coating. In some examples, applying coating 116 including a plurality of voids 122 may include applying coating 116 having a porous microstructure including a plurality of pores (e.g., as seen in FIGS. 8B and 9B), applying coating 116 having a columnar microstructure including a plurality of columns and a plurality of intercolumnar voids (e.g., as seen in FIGS. 8A and 9A), or a combination thereof. As described herein, each void of the plurality of voids 122 of coating 116 defines a respective void volume.

Coating 116 may be applied on substrate 112 using any one or more of a wide variety of coating techniques, including, for example, thermal spraying such as plasma spraying or suspension plasma spraying, physical vapor deposition (PVD) such as EB-PVD (electron beam physical vapor deposition) or DVD (directed vapor deposition), cathodic arc deposition, slurry process deposition, sol-gel process deposition, plasma spray physical vapor deposition (PSPVD), air plasma spraying, or combinations thereof. In some cases, the porosity of coating 116 may be created and/or controlled by the technique used to apply coating 116 on substrate 112. For example, plasma spraying the coating material from which coating 116 is formed with a coating material additive and injecting the material on the outer edge of the plasma plume using direct 90-degree angle injection may be used to apply coating 116 including a porous microstructure. Additionally, or alternatively, the porosity of coating 116 may be controlled by the use of coating material additives and/or processing techniques to create the desired porosity. In other examples, the porosity of coating 116 may be created or controlled in a different manner. In some examples, a suspension plasma spray technique, an EB-PVD technique, a plasma spray physical vapor deposition (PSPVD) technique, or a directed vapor deposition (DVD) technique may be used to apply coating 116 on substrate 112 with a columnar microstructure.

The technique of FIG. 11 further includes depositing rare-earth metal phosphate 118 within at least some of the respective void volumes (152). For example, rare-earth metal phosphate 118 may be deposited within at least some voids of the plurality of voids 122 by at least one of EB-PVD (electron beam physical vapor deposition), sol-gel process deposition, slurry process deposition, a vacuum infiltration technique, or a suspension plasma spray technique. Rare-earth metal phosphate 118 may include a monazite phase rare-earth phosphate including at least one of lanthanum phosphate or cerium phosphate. Rare-earth metal phosphate 118 may additionally, or alternatively, include a xenotime phase rare-earth phosphate. The xenotime phase rare-earth metal phosphate may include at least one of yttrium phosphate, dysprosium phosphate, ytterbium phosphate, or lutetium phosphate. In some examples, rare-earth metal phosphate 118 includes a greater amount of the monazite phase rare-earth phosphate than the xenotime phase rare-earth phosphate, which may result in rare-earth metal phosphate 118 better matching the coefficient of thermal expansion of a material that forms coating 116 and reducing infiltration of CMAS or other deleterious environmental species into coating 116. In some cases, rare-earth metal phosphate 118 may also include an additive, such as, for example, at least one of a rare-earth oxide, a rare-earth aluminate, or alumina.

In some examples, rare-earth metal phosphate 118 may be deposited within at least some void volumes of respective voids 122 of coating 116 using sol-gel process deposition, slurry process deposition, or a vacuum infiltration technique. In such examples, a solution including rare-earth metal phosphate 118 and any additives or chemical agents may be formed, and the solution may be deposited within at least some voids of the plurality of voids 122. In some cases, the solution may include rare-earth metal phosphate 118, a solvent, and/or one or more additives or chemical agents. In cases in which a vacuum infiltration technique is used to deposit rare-earth metal phosphate 118 within at least some void volumes of respective voids 122, a vacuum may be pulled on article 110 including coating 116 to evacuate the pores. Then, a slurry, sol-gel, or another solution may be applied to article 110 under pressure such that the slurry, sol-gel, or another solution infiltrates and at least partially fills at least some voids 122 of coating 116. Once the solution is deposited within at least some void volumes of respective voids of the plurality of voids 122, the article 110 may be dried, such as, for example, to remove a solvent or a chemical agent.

In some examples, the rare-earth metal phosphate 118 may be added to the solution in the desired phase. For example, a plasma spray technique may be used to form a coating material including rare-earth metal phosphate 118 in the desired phase, such as a monazite or xenotime phase. Relatively high temperatures (e.g., temperatures between about 600° C. and about 800° C.) may be required to form the desired phase of rare-earth metal phosphate 118. For example, relatively high temperatures may be required to remove any excess phosphate in rare-earth metal phosphate 118 that may affect the phase that rare-earth metal phosphate 118 forms. In such cases, the relatively high temperatures may be higher than allowed by sol-gel process deposition, slurry process deposition, and/or a vacuum infiltration technique, e.g., without damaging the underlying substrate 112. Thus, forming the rare-earth metal phosphate 118 in the desired phase prior to forming the solution may enable the rare-earth metal phosphate 118 to be deposited within at least some voids 122 in the desired phase using a technique including sol-gel process deposition, slurry process deposition, or a vacuum infiltration technique and/or may help prevent damage to substrate 112.

In other examples, the solution may include individual components that form rare-earth metal phosphate 118 (e.g., the rare-earth metal and the phosphate), and rare-earth metal phosphate 118 may be deposited with a set of processing parameters to form rare-earth metal phosphate 118 in the desired phase.

In some examples, a suspension plasma spray technique may be used to deposit rare-earth metal phosphate 118 within at least some void volumes of the respective voids of the plurality of voids 122. In such examples, a suspension including a solvent and the rare-earth metal phosphate 118 may be formed and deposited using a plasma spray device. Similar to the solution formed for deposition of rare-earth metal phosphate 118 using sol-gel process deposition, slurry process deposition, or a vacuum infiltration technique, the suspension may include rare-earth metal phosphate 118 in the desired phase or may include the individual components that form rare-earth metal phosphate 118 (e.g., the rare-earth metal and the phosphate). In the case in which the suspension includes the individual components that form rare-earth metal phosphate 118, the deposition parameters of the suspension plasma spray system may determine the phase that rare-earth metal phosphate 118 is deposited in.

Depositing rare-earth metal phosphate 118 within at least some of the respective void volumes of respective voids of the plurality of voids 122 may include depositing rare-earth metal phosphate 118 within at least some of the respective void volumes such that rare-earth metal phosphate 118 does not fully fill any of the respective void volumes in which rare-earth metal phosphate 118 is present. For example, rare-earth metal phosphate may be deposited within the respective void volumes such that rare-earth metal phosphate 118 fills between about 2% and about 90% of each respective void volume in which rare-earth metal phosphate 118 is present. In turn, in some examples, rare-earth metal phosphate 118 may only fill a portion of each respective void volume of a respective void 122, rare-earth metal phosphate 118 may be within only a portion of the plurality of voids 122, or both. Thus, coating system 114 may include a relatively porous or columnar structure, even with rare-earth metal phosphate 118 within at least some voids of the plurality of voids 122 of coating 116, which may enable coating system 114 to protect against deleterious environmental species, have good thermal cycling performance, a low thermal conductivity, increased fracture toughness and mechanical strength, or the like.

In some examples, the technique of FIG. 11 additionally includes applying rare-earth metal phosphate 118 as a layer on coating 116. For example, in addition to, or as an alternative to, rare-earth metal phosphate 118 being deposited within at least some voids of the plurality of voids of coating 116, rare-earth metal phosphate 118 may be deposited as a relatively thin layer on coating 116 (e.g., as illustrated in FIG. 7). In some examples, the layer including rare-earth metal phosphate 118 may be on coating 116 such that surface 119 of coating 116 is substantially or fully covered by the layer, which may further help protect coating 116 and/or underlying substrate 112 from exposure to CMAS, water vapor, and/or other deleterious environmental species.

EXAMPLES

Various experiments were performed to evaluate aspects of some examples of the disclosure. However, the disclosure is not limited by the experiments or the corresponding description.

Two example nucleating agents ($TiO_2$ and $Y_2O_3$) were evaluated with regard to an abradable coating. As will be described below, the nucleating agents were infiltrated into the open voids of abradable coating samples, with a first set of the abradable coating specimens infiltrated with $TiO_2$ and a second set of abradable coating specimens infiltrated with $Y_2O_3$. Abradable coating specimens that did not include a nucleating agent in the open voids of the coating were also included in the testing as reference specimens. During the testing, CMAS infiltration was simulated on the specimens at various conditions. The two sets of tested specimens including nucleating agents were evaluated and compared to each other as well as to the set of abradable coating specimens that did not include a nucleating agent in the voids of the abradable coating.

Figure 12B:
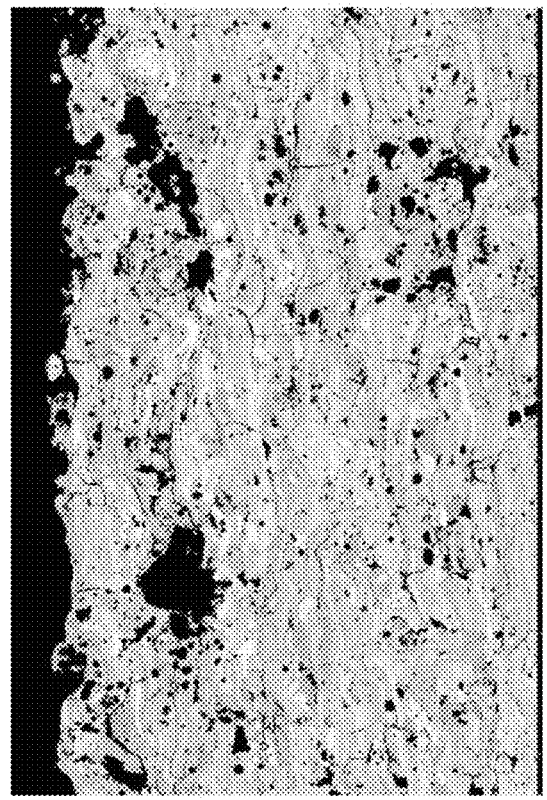
FIGS. 12A to 18 are images and plots relating to testing performed to evaluate aspects of some examples of the disclosure.
Figure 12A:
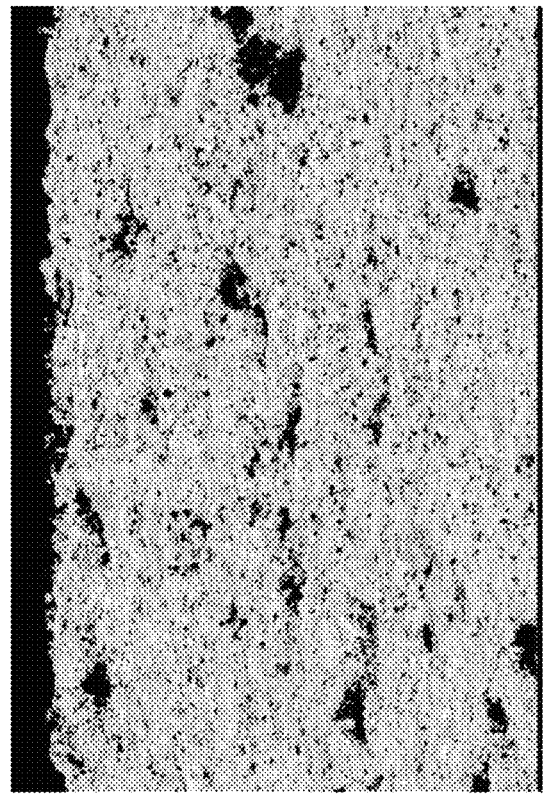

Freestanding abradable coating +EBC specimens were produced by air plasma spray, with an abradable coating on an underlying EBC. The abradable and EBC powders were predominantly comprised of a rare earth disilicate. The abradable +EBC specimens are hereafter referred to as the abradable coating in the below description. FIGS. 12A and 12b are cross-sectional images of the abradable coating specimens, with FIG. 12B being a magnified view of a portion of the image of FIG. 12B.

Figures 13A, 13B:
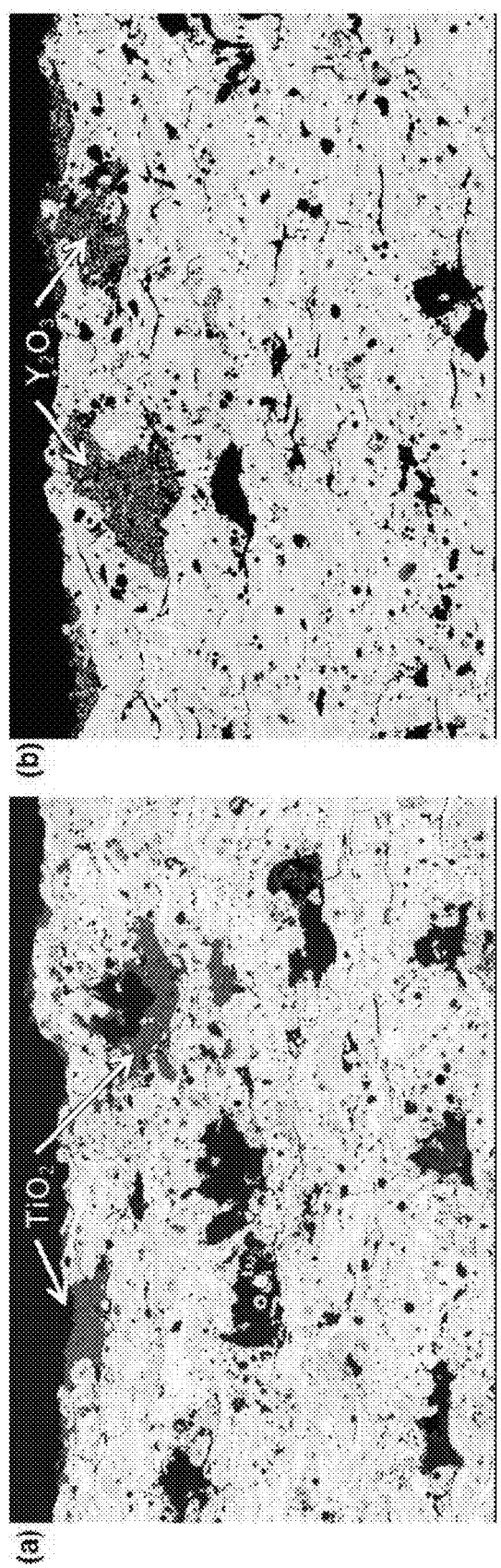

$TiO_2$ and $Y_2O_3$ powders were infiltrated into abradable coating specimens by mixing the respective powder with a liquid to create a slurry, submerging the specimen in the slurry and pulling vacuum. All slurries produced contained about 10 vol. % nucleating agent—about 90 vol. % liquid, with the liquid carrier being NICROBRAZ 520 (available from Wall Colmonoy Corporation, MI). FIGS. 13A and 13B are cross-sectional images of abradable coating specimens after infiltration with $TiO_2$ nucleating agent (FIG. 13A) and with $Y_2O_3$ nucleating agent (FIG. 13B) and a heat treatment.

CMAS was applied to the surfaces of the specimens with loadings of approximately 10 milligrams per centimeter squared ($mg/cm^2$) and approximately 20 $mg/cm^2$. The composition the CMAS is shown in Table 1.

TABLE 1

CMAS composition

| Component | Mol % |
|---|---|
| $Al_2O_3$ | 6.6 |
| CaO | 31.5 |
| MgO | 11.6 |
| $SiO_2$ | 50.3 |

The abradable coating specimens without and with $TiO_2$ and $Y_2O_3$ nucleating agents were reacted the CMAS in a box furnace under the conditions shown in Table 2.

TABLE 2

Test Conditions

| Temperature (Celsius) | Time (h) | CMAS Loading ($mg/cm^2$) |
|---|---|---|
| 1300 | 4 | about 10 |
| 1300 | 8 | about 20 |
| 1300 | 24 | about 10 |
| 1400 | 8 | about 20 |

CMAS infiltration depth was measured on each specimen using cross-sectional images of the specimens. Specimens with $TiO_2$ and $Y_2O_3$ formed the same reaction products and exhibited similar microstructural changes as the abradable coating without a nucleating agent. Cross-sectional images comparing the CMAS attack on the abradable coating without and with $TiO_2$ and $Y_2O_3$ nucleating agents are shown in FIGS. 14 to 17. A plot comparing the CMAS infiltration depths of each specimen for each test condition is shown in FIG. 18.

Figure 14:
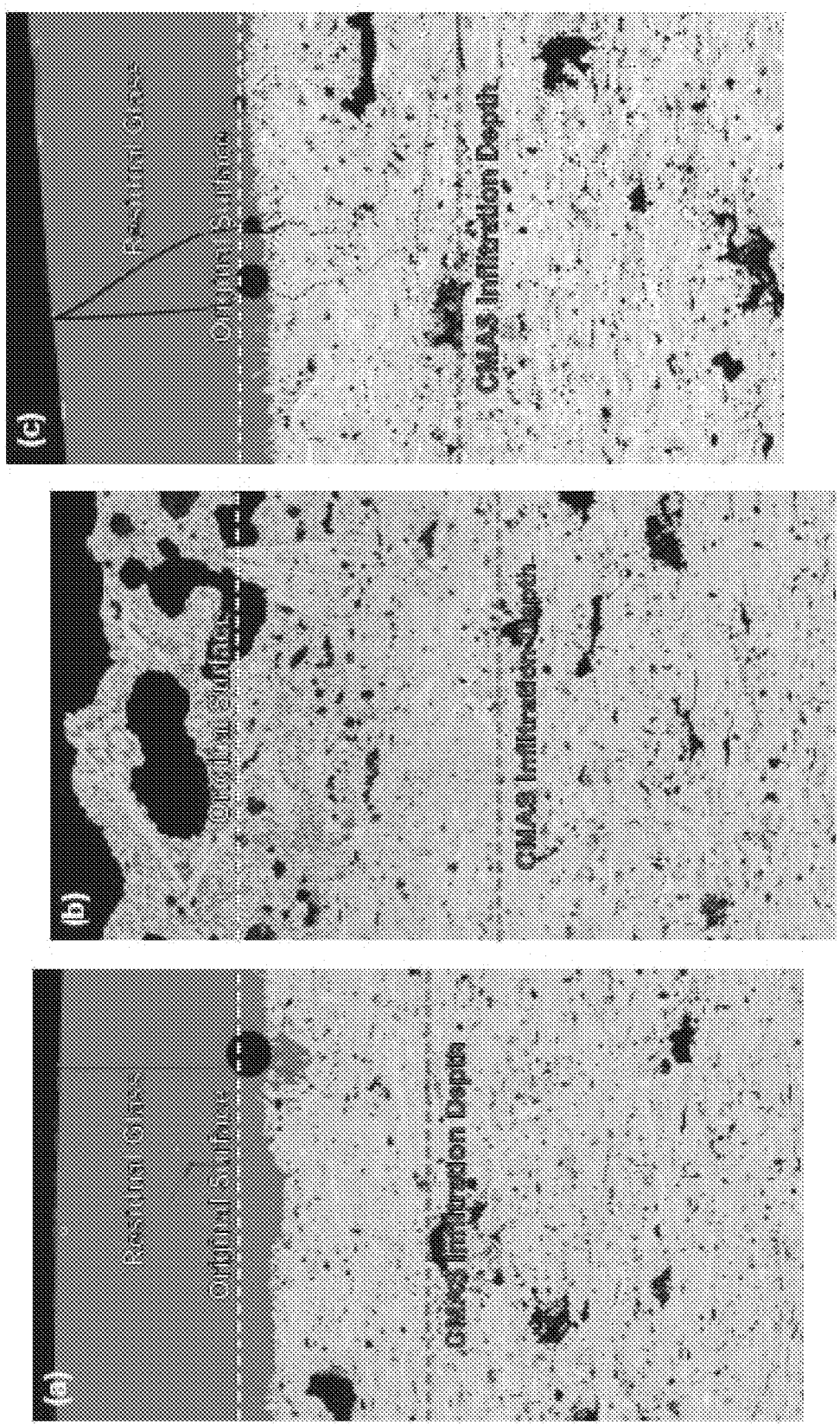

FIG. 14 shows images of the abradable coating after exposure to CMAS at 1300° C. for 4 hours with about 10 $mg/cm^2$ CMAS loading: (a) without nucleating agent, (b) with $TiO_2$ nucleating agent and (c) with $Y_2O_3$ nucleating agent.

Figure 15:
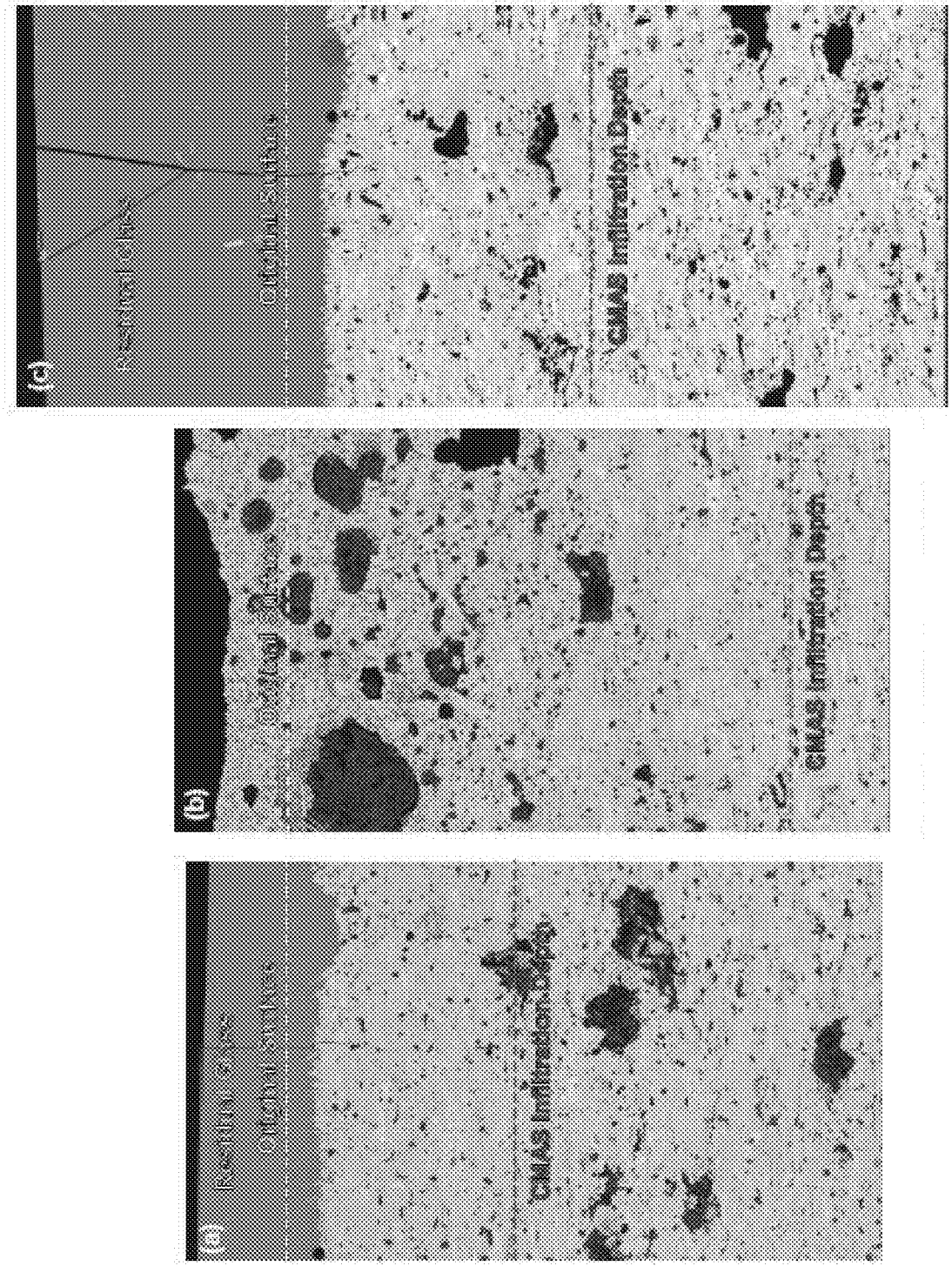

FIG. 15 shows images of the abradable coating after exposure to CMAS at 1300° C. for 8 hours with about 20 $mg/cm^2$ CMAS loading: (a) without nucleating agent, (b) with $TiO_2$ nucleating agent and (c) with $Y_2O_3$ nucleating agent.

Figure 16:
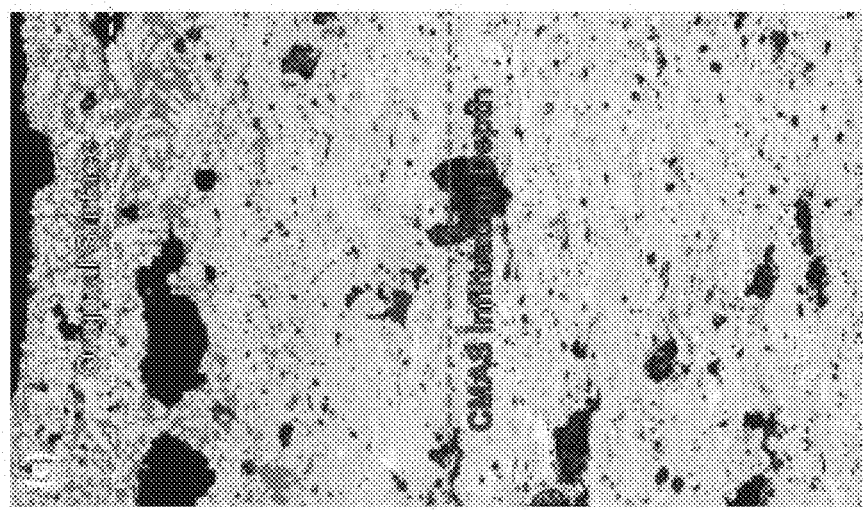
Figure 16:
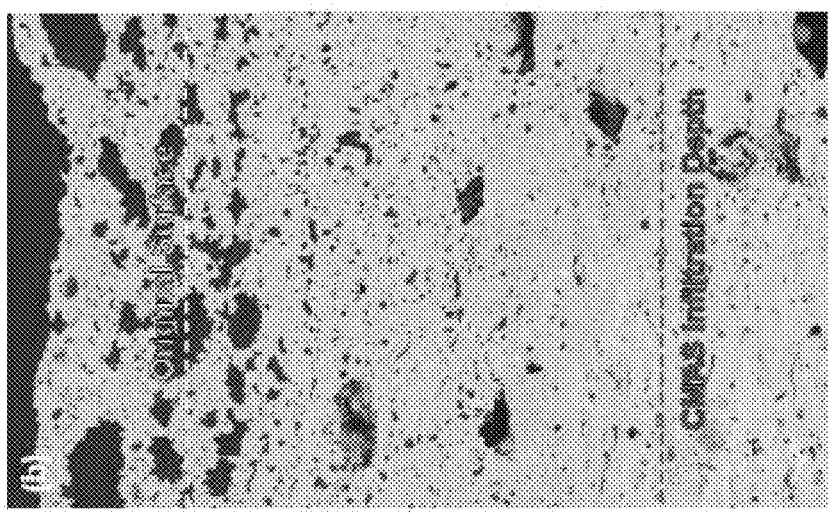
Figure 16:
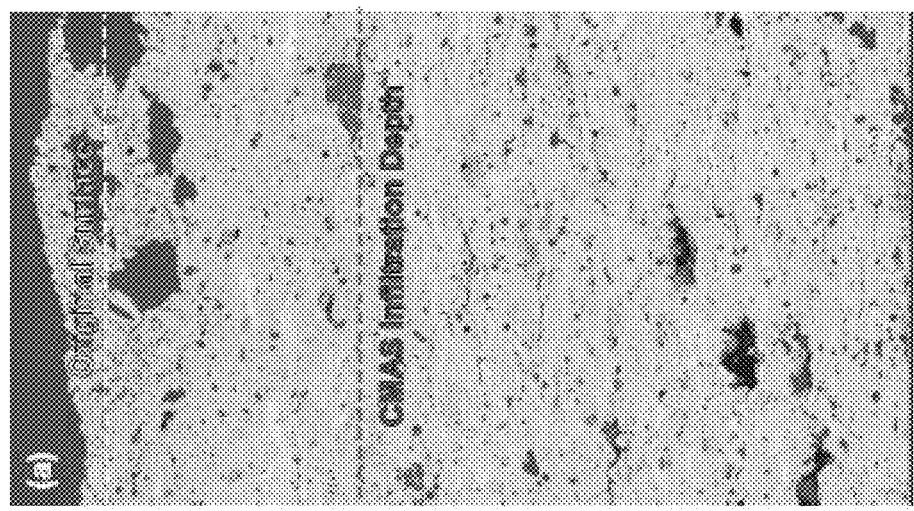

FIG. 16 shows images of the abradable coating after exposure to CMAS at 1300° C. for 24 hours with about 10 $mg/cm^2$ CMAS loading: (a) without nucleating agent, (b) with $TiO_2$ nucleating agent and (c) with $Y_2O_3$ nucleating agent.

Figure 17:
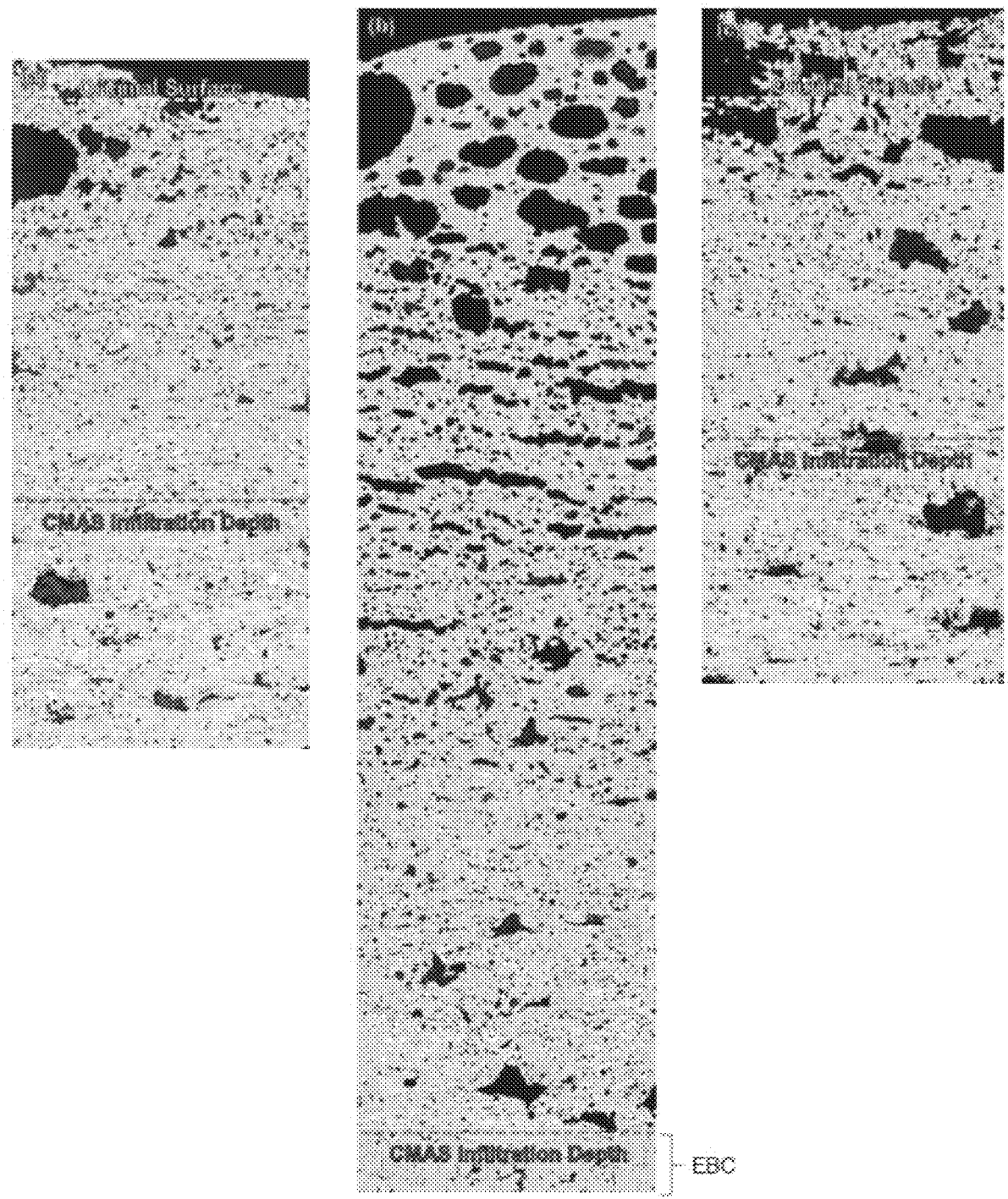
Figure 18:
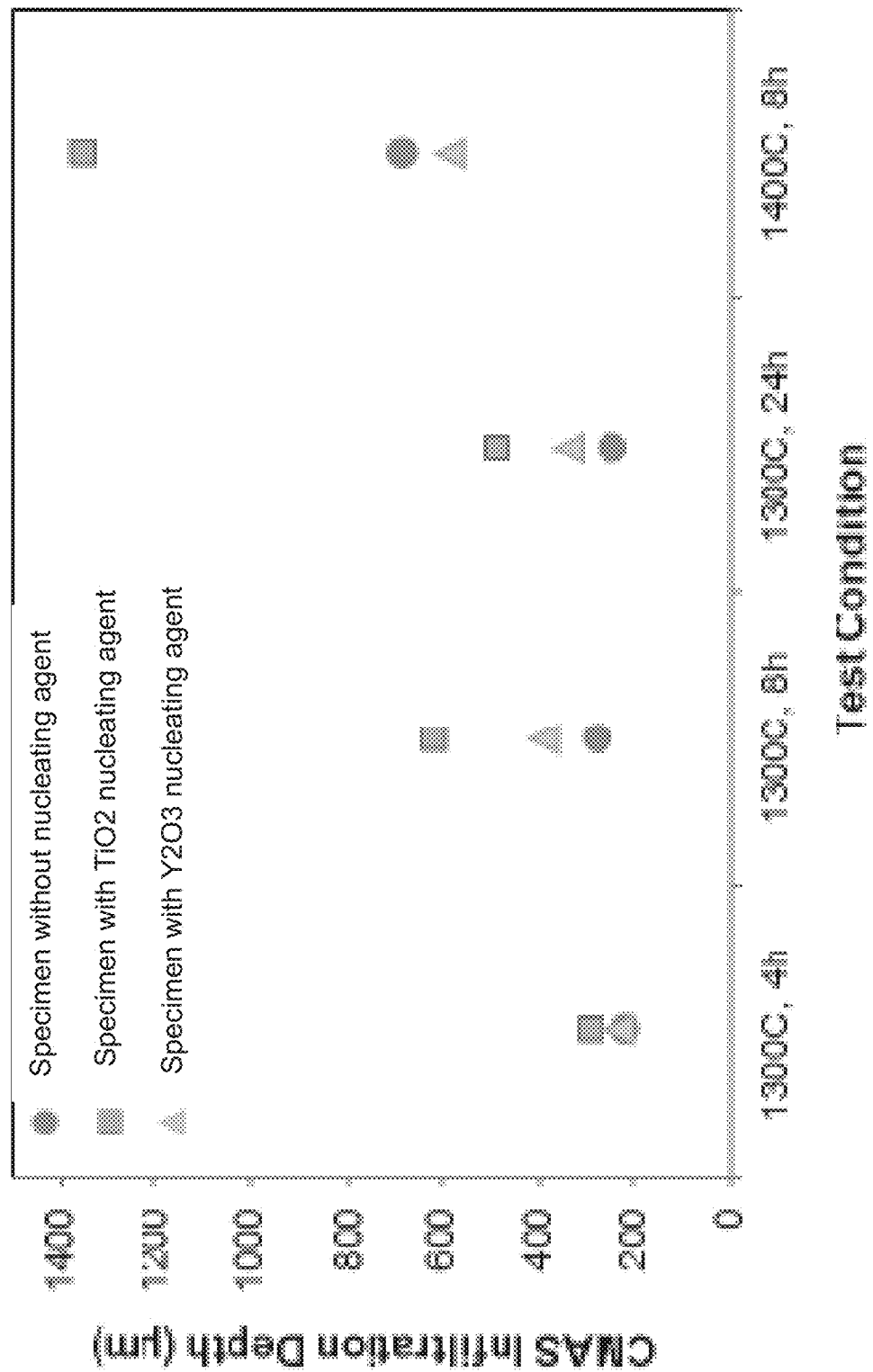

FIG. 17 shows images of the abradable coating after exposure to CMAS at 1400° C. for 8 hours with about 20 $mg/cm^2$ CMAS loading: (a) without nucleating agent, (b) with $TiO_2$ nucleating agent and (c) with $Y_2O_3$ nucleating agent.

FIG. 18 is a plot of CMAS infiltration depths measured on abradable coatings without and with $TiO_2$ and $Y_2O_3$ nucleating agents after exposure to CMAS for the various test conditions.

Exposure of the abradable coating without and with $TiO_2$ and $Y_2O_3$ nucleating agents to CMAS resulted in the dissolution of the coating and the formation of apatite ($Ca_2Yb_8(SiO_4)6O_2$) and garnet (Ca—Mg—Al—Yb—Si—O) phases. Results of the experiments demonstrated that a quantity of a nucleating agent may have an impact on the CMAS infiltration of the coating. Under each test condition, the CMAS infiltration was different for the specimens with the nucleating agent compared to the specimens without the nucleating agents. In the case of the 1400 degrees Celsius for 8 h test condition, the specimens infiltrated with the $Y_2O_3$ nucleating agent showed the least depth of CMAS infiltration, which demonstrated that a nucleating agent may reduce CMAS infiltration (e.g., to improve CMAS resistance of a coating).

Various examples have been described. These and other examples are within the scope of the following clauses and claims.

Clause 1. An article comprising a substrate; and a coating system on the substrate, the coating system comprising an environmental barrier coating (EBC) layer comprising a plurality of voids, wherein respective voids of the plurality of voids define respective void volumes; and a nucleating agent within at least some of the respective void volumes of the EBC layer, wherein the nucleating agent is configured to induce crystallization of the molten CMAS.

Clause 2. The article of clause 1, wherein the nucleating agent includes at least one of metal oxide, a rare earth titanate, a rare earth zirconate, a rare earth phosphate, a metal with a melting temperature greater than 1400 degrees Celsius, or a metal alloy with a melting temperature greater than 1400 degrees Celsius.

Clause 3. The article of clauses 1 or 2, wherein the nucleating agent includes at least one of a $TiO_2$, a rare earth oxide, $Y_2O_3$, $Sc_2O_3$, $ZrO_2$, $HfO_2$, $Ta_2O_5$, $Nb_2O_5$, or $Cr_2O_3$.

Clause 4. The article of any of clause 1-3, wherein a crystallization of the molten CMAS is configured to form a barrier between residual molten CMAS and the EBC layer.

Clause 5. The article of any of clause 1-4, wherein the nucleating agent includes particulate of the nucleating agent.

Clause 6. The article of any of clause 1-5, wherein the nucleating agent does not fully fill any of the respective void volumes.

Clause 7. The article of any of clause 1-6, wherein the nucleating agent fills about 0.1 percent (%) and about 100% of each respective void volume.

Clause 8. The article of any of clause 1-7, wherein the coating system further comprises a layer including the nucleating agent on an outer surface of the EBC layer.

Clause 9. The article of any of clause 1-8, wherein the plurality of voids comprises a plurality of pores of a porous microstructure or a plurality of intercolumnar voids.

Clause 10. The article of any of clause 1-9, wherein the EBC layer includes an abradable EBC layer.

Clause 11. A method comprising applying an environmental barrier coating (EBC) coating system on a substrate, wherein the EBC coating system includes an EBC layer comprising a plurality of voids on a substrate, wherein respective voids of the plurality of voids define respective void volumes, and a nucleating agent within at least some of the respective void volumes of the EBC layer, wherein the nucleating agent is configured to induce crystallization of the molten CMAS.

Clause 12. The method of clause 11, wherein applying the EBC coating system on the substrate comprises applying the EBC layer comprising the plurality of voids on the substrate; and infiltrating the nucleating agent into the at least some of the respective void volumes following application of the EBC layer on the substrate.

Clause 13. The method of clause 11, wherein applying the EBC coating system on the substrate comprises applying the EBC layer comprising the plurality of voids on the substrate; and depositing the nucleating agent onto an outer surface of the EBC layer following application of the EBC layer on the substrate, wherein the outer surface of the EBC layer includes the at least some of the respective void volumes.

Clause 14. The method of clause 11, wherein the EBC layer comprises an EBC material, wherein applying the EBC coating system on the substrate comprises depositing the EBC material and a fugitive material incorporating the nucleating agent with the EBC material on the substrate to form the EBC layer.

Clause 15. The method of clause 14, wherein applying the EBC coating system on the substrate comprises removing the fugitive material from the EBC layer to form the at least some respective void volumes including the nucleating agent.

Clause 16. The method of any of clauses 11-15, wherein the nucleating agent includes at least one of a metal oxide, a rare earth titanate, a rare earth zirconate, a rare earth phosphate, a metal with a melting temperature greater than 1400 degrees Celsius, or a metal alloy with a melting temperature greater than 1400 degrees Celsius.

Clause 17. The method of any of clauses 11-16, wherein the nucleating agent includes at least one of a $TiO_2$, a rare earth oxide, $Y_2O_3$, $Sc_2O_3$, $ZrO_2$, $HfO_2$, $Ta_2O_5$, $Nb_2O_5$, or $Cr_2O_3$.

Clause 18. The method of any of clauses 11-17, wherein a crystallization of the molten CMAS is configured to form a barrier between residual molten CMAS and the EBC layer.

Clause 19. The method of any of clauses 11-18, wherein the nucleating agent includes particulate of the nucleating agent.

Clause 20. The method of any of clauses 11-19, wherein the nucleating agent does not fully fill any of the respective void volumes.

Clause 21. The method of any of clauses 11-20, wherein the nucleating agent fills about 0.1 percent (%) and about 100% of each respective void volume.

Clause 22. The method of any of clauses 11-21, wherein the coating system further comprises a layer including the nucleating agent on an outer surface of the EBC layer.

Clause 23. The method of any of clauses 11-22, wherein the plurality of voids comprises a plurality of pores of a porous microstructure or a plurality of intercolumnar voids.

Clause 24. The method of any of clauses 11-23, wherein the EBC layer includes an abradable EBC layer.

Clause 25. A method comprising depositing an EBC material and a fugitive material incorporating a nucleating agent with the EBC material on a substrate to form an EBC layer, and removing the fugitive material from the EBC layer to form a plurality of voids defining respective void volumes in the EBC layer, wherein at least some respective void volumes include the nucleating agent, wherein the nucleating agent is configured to induce crystallization of the molten CMAS.

Clause 26. The method of clause 25, further comprising infiltrating the nucleating agent into the at least some of the respective void volumes of the EBC layer on the substrate.

Clause 27. The method of any of clauses 25 or 26, further comprising depositing the nucleating agent onto an outer surface of the EBC layer on the substrate, wherein the outer surface of the EBC layer includes the at least some of the respective void volumes.

Clause 28. The method of any of clauses 25-27, wherein the nucleating agent includes at least one of a metal oxide, a rare earth titanate, a rare earth zirconate, a rare earth phosphate, a metal with a melting temperature greater than 1400 degrees Celsius, or a metal alloy with a melting temperature greater than 1400 degrees Celsius.

Clause 29. The method of any of clauses 25-28, wherein the nucleating agent includes at least one of a $TiO_2$, a rare earth oxide, $Y_2O_3$, $Sc_2O_3$, $ZrO_2$, $HfO_2$, $Ta_2O_5$, $Nb_2O_5$, or $Cr_2O_3$.

Clause 30. The method of any of clauses 25-29, wherein a crystallization of the molten CMAS is configured to form a barrier between residual molten CMAS and the EBC layer.

Clause 31. The method of any of clauses 25-30, wherein the nucleating agent includes particulate of the nucleating agent.

Clause 32. The method of any of clauses 25-31, wherein the nucleating agent does not fully fill any of the respective void volumes.

Clause 33. The method of any of clauses 25-32, wherein the nucleating agent fills about 0.1 percent (%) and about 100% of each respective void volume.

Clause 34. The method of any of clauses 25-33, wherein the coating system further comprises a layer including the nucleating agent on an outer surface of the EBC layer.

Clause 35. The method of any of clauses 25-34, wherein the plurality of voids comprises a plurality of pores of a porous microstructure or a plurality of intercolumnar voids.

Clause 36. The method of any of clauses 25-35, wherein the EBC layer includes an abradable EBC layer.

Clause 37. An article comprising a substrate; a coating system on the substrate, comprising a thermal barrier coating (TBC) or an abradable coating comprising a plurality of voids, wherein respective voids of the plurality of voids define respective void volumes; and a rare-earth metal phosphate, wherein the rare-earth metal phosphate is within at least some of the respective void volumes.

Clause 38. The article of clause 37, wherein the rare-earth metal phosphate comprises a monazite phase rare-earth phosphate and a xenotime phase rare-earth phosphate.

Clause 39. The article of clause 38, wherein the monazite phase rare-earth phosphate comprises at least one of lanthanum phosphate or cerium phosphate, and the xenotime phase rare-earth phosphate comprises at least one of yttrium phosphate, dysprosium phosphate, ytterbium phosphate, or lutetium phosphate.

Clause 40. The article of clause 38 or 39, wherein the rare-earth phosphate comprises a greater amount of the monazite phase rare-earth phosphate than the xenotime phase rare-earth phosphate.

Clause 41. The article of any one of clauses 37 to 40, wherein the rare-earth phosphate does not fully fill any of the respective void volumes.

Clause 42. The article of clause 41, wherein the rare-earth metal phosphate fills between about 2% and about 90% of each respective void volume.

Clause 43. The article of any one of clauses 37 to 42, wherein the coating system further comprises a layer including the rare-earth metal phosphate on the TBC or the abradable coating.

Clause 44. The article of any one of clauses 37 to 43, wherein the rare-earth metal phosphate comprises an additive comprising at least one of a rare-earth oxide, a rare-earth aluminate, alumina, or stabilized zirconia or hafnia.

Clause 45. The article of any one of clauses 37 to 44, wherein the plurality of voids comprises a plurality of pores of a porous microstructure or a plurality of intercolumnar voids.

Clause 46. A method comprising applying a thermal barrier coating (TBC) or an abradable coating comprising a plurality of voids on a substrate, wherein respective voids of the plurality of voids define respective void volumes; and depositing a rare-earth metal phosphate within at least some of the respective void volumes.

Clause 47. The method of clause 46, wherein the rare-earth metal phosphate comprises a monazite phase rare-earth phosphate comprising at least one of lanthanum phosphate or cerium phosphate, and a xenotime phase rare-earth phosphate comprising at least one of yttrium phosphate, dysprosium phosphate, ytterbium phosphate, or lutetium phosphate, and wherein the rare-earth metal phosphate comprises a greater amount of the monazite phase rare-earth phosphate than the xenotime phase rare-earth phosphate.

Clause 48. The method of clause 46 or 47, wherein applying the TBC or the abradable coating comprising the plurality of voids on the substrate comprises applying the TBC or the abradable coating comprising the plurality of voids on the substrate using an electron-beam physical vapor deposition technique or a thermal spray technique.

Clause 49. The method of any one of clauses 46 to 48, wherein depositing the rare-earth metal phosphate within at least some of the respective void volumes comprises depositing the rare-earth metal phosphate within at least some of the respective void volumes using sol-gel process deposition, slurry process deposition, a suspension plasma spray technique, or a vacuum infiltration technique.

Clause 50. The method of any one of clauses 46 to 49, wherein the rare-earth phosphate does not fully fill any of the respective void volumes.

Clause 51. The method of clause 50, wherein the rare-earth metal phosphate fills between about 2% and about 90% of each respective void volume.

Clause 52. The method of any one of clauses 46 to 51, further comprising applying a rare-earth metal phosphate as a layer on the TBC or the abradable coating.

Clause 53. The method of any one of clauses 46 to 52, wherein the rare-earth metal phosphate comprises an additive comprising at least one of a rare-earth oxide, a rare-earth aluminate, or alumina.

Clause 54. The method of any one of clauses 46 to 53, wherein applying the TBC or the abradable coating comprising the plurality of voids on the substrate comprises applying the TBC or the abradable coating having a porous microstructure comprising a plurality of pores; or applying the TBC or the abradable coating having a columnar microstructure comprising a plurality of columns and a plurality intercolumnar voids.

Clause 55. An article comprising a substrate; a coating system on the substrate, comprising a thermal barrier coating (TBC) or an abradable coating comprising a plurality of voids; and a rare-earth metal phosphate comprising a monazite phase rare-earth phosphate comprising at least one of lanthanum phosphate or cerium phosphate, and a xenotime phase rare-earth phosphate comprising at least one of yttrium phosphate, dysprosium phosphate, ytterbium phosphate, or lutetium phosphate, wherein the rare-earth metal phosphate comprises a greater amount of the monazite phase rare-earth phosphate than the xenotime phase rare-earth phosphate, and wherein the rare-earth metal phosphate partially fills at least some voids of the plurality of voids of the TBC or the abradable coating.

Clause 56. The article of clause 55, wherein the rare-earth metal phosphate fills between about 2% and about 90% of the at least some voids.

What is claimed is:

1. An article comprising:
a substrate; and
a coating system on the substrate, the coating system comprising:
a layer comprising a plurality of subsurface voids, wherein respective subsurface voids of the plurality of subsurface voids define respective subsurface void volumes, wherein the layer comprises an environmental barrier coating (EBC) layer including at least one of a rare-earth silicate, an aluminosilicate, or an alkaline earth aluminosilicate; and
a nucleating agent on an outer surface of the layer and within at least some of the respective subsurface void volumes of the layer, wherein the nucleating agent is configured to induce crystallization of molten Calcium-Magnesium-Alumino-Silicate (CMAS) in at least some of the respective subsurface void volumes of the layer.

2. The article of claim 1, wherein the nucleating agent includes at least one of a metal oxide, a rare earth titanate, a rare earth zirconate, a rare earth phosphate, a metal with a melting temperature greater than 1400 degrees Celsius, or a metal alloy with a melting temperature greater than 1400 degrees Celsius.

3. The article of claim 1, wherein the nucleating agent includes at least one of a rare earth metal phosphate, $TiO_2$, $Y_2O_3$, $Sc_2O_3$, $ZrO_2$, $HfO_2$, $Ta_2O_5$, $Nb_2O_5$, or $Cr_2O_3$.

4. The article of claim 1, wherein the EBC layer includes an abradable EBC layer.

5. The article of claim 1, wherein the plurality of subsurface voids comprises a plurality of pores of a porous microstructure or a plurality of intercolumnar voids.

6. The article of claim 1, wherein the nucleating agent does not fully fill any of the respective subsurface void volumes.

7. The article of claim 1, wherein the coating system further comprises a layer including the nucleating agent on the outer surface of the layer including the plurality of subsurface voids.

8. The article of claim 1, wherein the nucleating agent includes at least one of yttrium monosilicate or scandium monosilicate.

9. The article of claim 1, wherein the nucleating agent includes at least one of CaO, MgO, $Al_2O_3$, a rare earth monosilicate, hafnium silicate, a rare earth phosphate, yttrium phosphate, scandium phosphate, calcium aluminate, magnesium aluminate, or gadolinium zirconate.

10. The article of claim 1, wherein the nucleating agent on the outer surface of the layer is included in a continuous layer on the outer surface of the layer.

11. The article of claim 1, wherein the nucleating agent on the outer surface of the layer is included in a discontinuous layer on the outer surface of the layer.

12. The article of claim 1, further comprising an abradable layer on the EBC layer, the abradable layer including a plurality of voids,
    wherein the nucleating agent is on a surface of the abradable layer and within at least some of the plurality of voids of the abradable layer, and
    wherein the nucleating agent is configured to induce crystallization of molten Calcium-Magnesium-Alumino-Silicate (CMAS) in at least some of the respective subsurface void volumes of the EBC layer and in at least some of the respective voids of the abradable EBC layer.

13. The article of claim 1, further comprising a bond layer between the substrate and the layer, the bond layer being directly on the substrate and the layer being directly on the bond layer.

14. The article of claim 1, wherein the EBC layer includes the rare-earth silicate.

15. The article of claim 1, wherein the plurality of subsurface voids comprises a plurality of subsurface pores of a porous microstructure, wherein respective subsurface pores of the plurality of subsurface pores define respective subsurface void volumes connected to a surface of the layer by a subsurface pore network, and wherein the nucleating agent is infiltrated within at least some of the respective subsurface void volumes of the layer connected to the surface of the layer by the subsurface pore network.

16. An article comprising:
    a substrate; and
    a coating system on the substrate, the coating system comprising:
        a layer comprising a plurality of voids, wherein respective voids of the plurality of voids define respective void volumes; and
        a nucleating agent within at least some of the respective void volumes of the layer, wherein the nucleating agent is configured to induce crystallization of molten Calcium-Magnesium-Alumino-Silicate (CMAS),
    wherein the layer comprises a thermal barrier coating (TBC) layer including zirconia stabilized with one or more oxides and/or hafnia stabilized with one or more oxides or an abradable coating layer,
    wherein the nucleating agent comprises a rare earth metal phosphate, and
    wherein the rare-earth metal phosphate comprises a monazite phase rare-earth phosphate and a xenotime phase rare-earth phosphate.

17. The article of claim 16, wherein the monazite phase rare-earth phosphate comprises at least one of lanthanum phosphate or cerium phosphate, and the xenotime phase rare-earth phosphate comprises at least one of yttrium phosphate, dysprosium phosphate, ytterbium phosphate, or lutetium phosphate.

18. The article of claim 16, wherein the rare-earth phosphate comprises a greater amount of the monazite phase rare-earth phosphate than the xenotime phase rare-earth phosphate.

19. An article comprising:
    a substrate;
    a coating system on the substrate, comprising:
        a thermal barrier coating (TBC) or an abradable coating comprising a plurality of voids; and
        a rare-earth metal phosphate comprising:
            a monazite phase rare-earth phosphate comprising at least one of lanthanum phosphate or cerium phosphate, and
            a xenotime phase rare-earth phosphate comprising at least one of yttrium phosphate, dysprosium phosphate, ytterbium phosphate, or lutetium phosphate,
            wherein the rare-earth metal phosphate comprises a greater amount of the monazite phase rare-earth phosphate than the xenotime phase rare-earth phosphate, and
    wherein the rare-earth metal phosphate partially fills at least some voids of the plurality of voids of the TBC or the abradable coating.

* * * * *